US012782712B2

(12) United States Patent
Zhou

(10) Patent No.: US 12,782,712 B2
(45) **Date of Patent: *Nov. 3, 2026**

(54) MICRO-ELECTRO-MECHANICAL SYSTEMS MICROMIRRORS AND MICROMIRROR ARRAYS

(71) Applicant: Preciseley Microtechnology Corp., Burnaby (CA)

(72) Inventor: Tiansheng Zhou, Edmonton (CA)

(73) Assignee: Preciseley Microtechnology Corporation, Burnaby (CA)

(*) Notice: Subject to any disclaimer, the term of this patent is extended or adjusted under 35 U.S.C. 154(b) by 299 days.

This patent is subject to a terminal disclaimer.

(21) Appl. No.: 18/537,100

(22) Filed: Dec. 12, 2023

(65) Prior Publication Data

US 2024/0111148 A1 Apr. 4, 2024

Related U.S. Application Data

(60) Continuation of application No. 18/145,302, filed on Dec. 22, 2022, now Pat. No. 11,927,741, which is a continuation of application No. 16/742,296, filed on Jan. 14, 2020, now Pat. No. 11,567,312, which is a continuation of application No. 14/702,874, filed on May 4, 2015, now Pat. No. 10,551,613, which is a division of application No. 13/267,045, filed on Oct. 6, 2011, now Pat. No. 9,036,231.

(60) Provisional application No. 61/455,348, filed on Oct. 20, 2010.

(51) Int. Cl.

| | |
|---|---|
| ***G02B 26/08*** | (2006.01) |
| ***B81C 1/00*** | (2006.01) |

(52) U.S. Cl.

CPC ........ *G02B 26/085* (2013.01); *B81C 1/00603* (2013.01); *G02B 26/0841* (2013.01); *B81B 2201/033* (2013.01); *B81B 2201/042* (2013.01); *B81B 2203/0136* (2013.01)

(58) Field of Classification Search

CPC .............. G02B 26/085; G02B 26/0841; B81C 1/00603

See application file for complete search history.

(56) References Cited

U.S. PATENT DOCUMENTS

| | | | |
|---|---|---|---|
| 4,772,786 | A | 9/1988 | Langdon |
| 5,083,857 | A | 1/1992 | Hornbeck |
| 5,146,435 | A | 9/1992 | Bernstein |
| 5,202,785 | A | 4/1993 | Nelson |
| 5,212,582 | A | 5/1993 | Nelson |

(Continued)

FOREIGN PATENT DOCUMENTS

| | | | |
|---|---|---|---|
| CA | 2 584 571 | A1 | 10/2007 |
| CA | 2 726 409 | A1 | 7/2011 |

(Continued)

*Primary Examiner* — Lucy P Chien

(74) *Attorney, Agent, or Firm* — Secant IP, P.L.L.C.

(57) ABSTRACT

A micromirror which comprises a mirror pivotally attached to a mount by a first pivoting structure that permits pivotal movement of the mirror relative to the mount about a first axis; a first comb drive which has a first position fixed relative to the mirror and second portion fixed relative to the mount. The first comb drive being for actuating the mirror about the first axis. A weight connected to the mirror, and the weight and mirror being on opposite sides of a fulcrum of the first pivoting structure. The first axis is non-parallel to a longitudinal axis extending through the weight and the mirror.

30 Claims, 26 Drawing Sheets

(56) References Cited

U.S. PATENT DOCUMENTS

| | | | |
|---|---|---|---|
| 5,233,456 | A | 8/1993 | Nelson |
| 5,408,731 | A | 4/1995 | Berggvist et al. |
| 5,452,268 | A | 9/1995 | Bernstein |
| 5,490,220 | A | 2/1996 | Loeppert |
| 5,583,688 | A | 12/1996 | Hornbeck |
| 5,734,492 | A | 3/1998 | Chung |
| 5,735,026 | A | 4/1998 | Min |
| 5,739,941 | A | 4/1998 | Knipe et al. |
| 5,760,947 | A | 6/1998 | Kim et al. |
| 5,870,482 | A | 2/1999 | Loeppert et al. |
| 6,012,335 | A | 1/2000 | Bashir et al. |
| 6,028,690 | A | 2/2000 | Carter et al. |
| 6,046,840 | A | 4/2000 | Huibers |
| 6,064,630 | A | 5/2000 | Fersht et al. |
| 6,204,080 | B1 | 3/2001 | Hwang |
| 6,272,926 | B1 | 8/2001 | Fehrenbach et al. |
| 6,275,320 | B1 | 8/2001 | Dhuler et al. |
| 6,459,845 | B1 | 10/2002 | Lee et al. |
| 6,522,762 | B1 | 2/2003 | Mullenborn et al. |
| 6,535,460 | B2 | 3/2003 | Loeppert et al. |
| 6,552,469 | B1 | 4/2003 | Pederson et al. |
| 6,581,465 | B1 | 6/2003 | Waters et al. |
| 6,628,856 | B1 | 9/2003 | Costello et al. |
| 6,654,473 | B2 | 11/2003 | Collins |
| 6,694,073 | B2 | 2/2004 | Golub et al. |
| 6,732,588 | B1 | 5/2004 | Mullenborn et al. |
| 6,744,173 | B2 | 6/2004 | Behin et al. |
| 6,751,395 | B1 | 6/2004 | Novotny et al. |
| 6,758,983 | B2 | 7/2004 | Conant et al. |
| 6,760,145 | B1 | 7/2004 | Taylor et al. |
| 6,763,116 | B2 | 7/2004 | Barthel et al. |
| 6,778,728 | B2 | 8/2004 | Taylor et al. |
| 6,780,180 | B1 | 8/2004 | Goble et al. |
| 6,780,185 | B2 | 8/2004 | Frei et al. |
| 6,781,231 | B2 | 8/2004 | Minervini |
| 6,781,744 | B1 | 8/2004 | Aksyuk et al. |
| 6,794,217 | B2 | 9/2004 | Lee et al. |
| 6,816,295 | B2 | 11/2004 | Lee et al. |
| 6,822,776 | B2 | 11/2004 | Hah et al. |
| 6,829,131 | B1 | 12/2004 | Loeb et al. |
| 6,829,814 | B1 | 12/2004 | Freeman et al. |
| 6,838,738 | B1 | 1/2005 | Costello et al. |
| 6,847,090 | B2 | 1/2005 | Loeppert |
| 6,859,542 | B2 | 2/2005 | Johannsen et al. |
| 6,876,810 | B2 | 4/2005 | Morimoto et al. |
| 6,881,649 | B2 | 4/2005 | Kouma et al. |
| 6,901,204 | B2 | 5/2005 | Hong et al. |
| 6,914,711 | B2 | 7/2005 | Novotny et al. |
| 6,915,061 | B2 | 7/2005 | Li et al. |
| 6,934,439 | B2 | 8/2005 | Mala et al. |
| 6,936,524 | B2 | 8/2005 | Zhu et al. |
| 6,954,579 | B2 | 10/2005 | Hsu |
| 6,963,679 | B1 | 11/2005 | Novotny et al. |
| 6,965,468 | B2 | 11/2005 | Huibers et al. |
| 6,968,101 | B2 | 11/2005 | Miller et al. |
| 6,969,635 | B2 | 11/2005 | Patel et al. |
| 6,970,281 | B2 | 11/2005 | Huibers et al. |
| 6,972,891 | B2 | 12/2005 | Patel et al. |
| 6,980,347 | B2 | 12/2005 | Patel et al. |
| 6,980,727 | B1 | 12/2005 | Lin et al. |
| 6,985,277 | B2 | 1/2006 | Huibers et al. |
| 6,996,306 | B2 | 2/2006 | Chen et al. |
| 7,010,188 | B2 | 3/2006 | Miller et al. |
| 7,023,066 | B2 | 4/2006 | Lee et al. |
| 7,051,590 | B1 | 5/2006 | Lemkin et al. |
| 7,053,981 | B2 | 5/2006 | Bleeker |
| 7,071,109 | B2 | 7/2006 | Novotny et al. |
| 7,091,057 | B2 | 8/2006 | Gan et al. |
| 7,095,546 | B2 | 8/2006 | Mala et al. |
| 7,110,635 | B2 | 9/2006 | Miller et al. |
| 7,114,397 | B2 | 10/2006 | Fortin et al. |
| 7,134,179 | B2 | 11/2006 | Freeman et al. |
| 7,154,173 | B2 | 12/2006 | Ikeda et al. |
| 7,177,063 | B2 | 2/2007 | Krylov et al. |
| 7,209,274 | B2 | 4/2007 | Van Drieenhuizen et al. |
| 7,224,097 | B2 | 5/2007 | Obi et al. |
| 7,239,774 | B1 | 7/2007 | Stowe et al. |
| 7,296,476 | B2 | 11/2007 | Fortin et al. |
| 7,305,889 | B2 | 12/2007 | Fortin et al. |
| 7,386,201 | B1 | 6/2008 | DiRuscio et al. |
| 7,535,620 | B2 | 5/2009 | Zhou |
| 7,734,127 | B2 | 6/2010 | Korevaar et al. |
| 7,863,799 | B1 | 1/2011 | Godil |
| 7,911,672 | B2 | 3/2011 | Zhou |
| 7,986,073 | B2 | 7/2011 | Godil |
| 8,238,018 | B2 | 8/2012 | Zhou |
| 2001/0048784 | A1 | 12/2001 | Behin et al. |
| 2002/0106828 | A1 | 8/2002 | Loeppert |
| 2003/0218793 | A1 | 11/2003 | Soneda et al. |
| 2004/0046111 | A1 | 3/2004 | Swierkowski |
| 2004/0085606 | A1 | 5/2004 | Valette |
| 2004/0184132 | A1 | 9/2004 | Novotny et al. |
| 2005/0061770 | A1 | 3/2005 | Neumann, Jr. et al. |
| 2005/0101047 | A1 | 5/2005 | Freeman et al. |
| 2005/0280883 | A1 | 12/2005 | Seo et al. |
| 2006/0008089 | A1 | 1/2006 | Willems |
| 2006/0093170 | A1 | 5/2006 | Zhe et al. |
| 2006/0093171 | A1 | 5/2006 | Zhe et al. |
| 2006/0210238 | A1 | 9/2006 | Ma et al. |
| 2007/0012110 | A1 | 1/2007 | Robert |
| 2007/0236775 | A1 | 10/2007 | Miller et al. |
| 2007/0241076 | A1 | 10/2007 | Moffat et al. |
| 2008/0272447 | A1 | 11/2008 | Sassolini et al. |
| 2009/0002798 | A1 | 1/2009 | Ohmori |
| 2009/0180169 | A1 | 7/2009 | Moidu et al. |
| 2010/0067084 | A1 | 3/2010 | Hagihara et al. |
| 2010/0103494 | A1 | 4/2010 | Moidu |
| 2010/0194235 | A1 | 8/2010 | Tsuboi et al. |

FOREIGN PATENT DOCUMENTS

| | | | |
|---|---|---|---|
| EP | 1 292 171 | A2 | 3/2003 |
| FR | 861 432 | | 2/1941 |
| WO | 2004/105428 | A1 | 12/2004 |

110

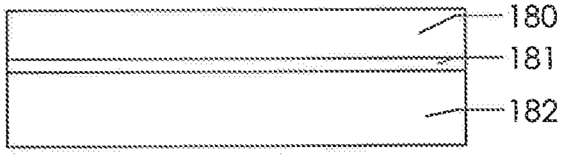
Fig. 20a
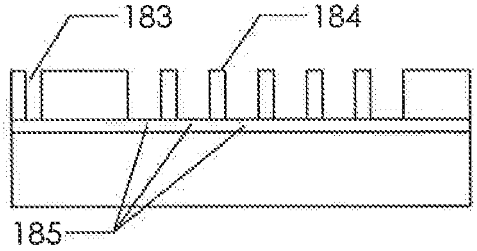
Fig. 20b
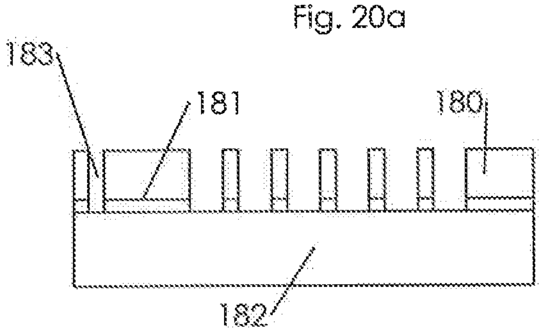
Fig. 20c
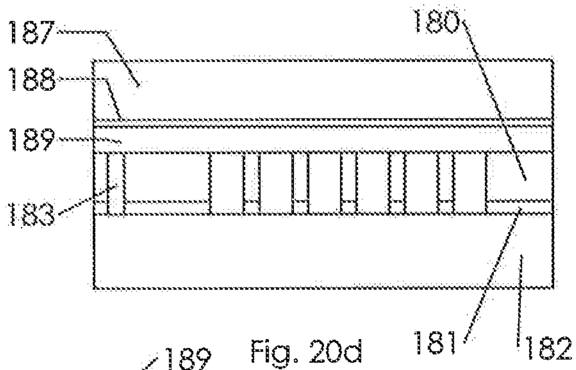
Fig. 20d
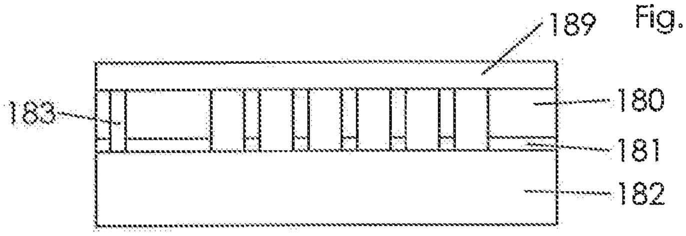
Fig. 20e
Fig. 20f
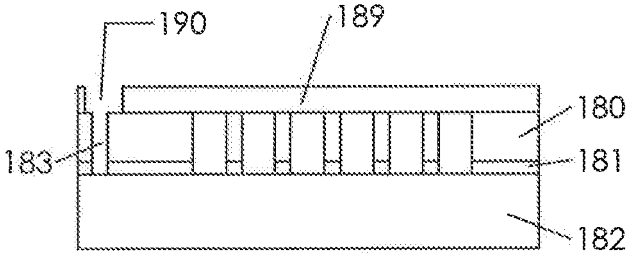
Fig. 20g
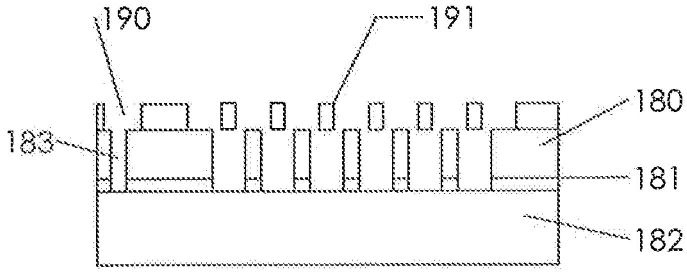

DETAIL D

MICRO-ELECTRO-MECHANICAL SYSTEMS MICROMIRRORS AND MICROMIRROR ARRAYS

BACKGROUND

The Micro-Electro-Mechanical Systems (MEMS) mirrors and mirror arrays have wide applications of light modulation such as optical switches, optical attenuators and optical tunable filter etc. in fiber optic networks. The high filling factor MEMS mirror arrays have particular importance in the wavelength division multiplexing systems. For example they can be used as Optical Cross-connection (OXC) switches, and Wavelength Selective Switches (WSS) etc. The filling factor is generally defined as the ratio of the active/reflective mirror area to the total area of an array. The high filling factor improves optical channel shape and reduces the optical loss in the system. In particular, a micromirror with two dimensional rotations can provide switching of the optical light beam among the channels while avoiding undesirable optical transient cross-talk during switching, and also provides variable optical attenuations.

The MEMS (Micro-Electro-Mechanical Systems) mirrors and mirror arrays also have wide applications in novel optical display, Optical scanners, optical spectrometer, mask less lithography, laser marking and novel light modulation etc.

The critical requirements for the micromirrors and micromirror arrays are larger mirror tilting/rotation angle, high filing factor and lower actuation voltage etc. The larger mirror arrays are required by the telecom industry for optical switches of higher port counts etc.

U.S. Pat. Nos. 7,734,127B2, 7,386,201B1, 6,881,649B2 and 6,822,776B2 disclosed the micromirror and micromirror arrays actuated using electrostatic vertical comb drive actuators. Electrostatic actuation is favored due to its low power consumption and relative simple structure and small footprint.

There are two fundamental obstacles in the above mentioned prior art in order to achieve the larger and high filling factor micromirror array with higher rotation angle and lower actuation voltage. The first obstacle is the extreme difficulty to make the powerful vertical comb drive actuator based on the materials and fabrication methods they chosen. The prior art uses a composite material, silicon/silicon oxide/silicon as the material to fabricate the mirror structure, upper comb fingers and lower comb fingers as well as electrical interconnection wires. In order to have larger actuation capacity or higher energy density of the vertical comb drive actuator, the air gaps between the adjacent comb fingers have to be as small as possible. Also in order to have the larger mirror rotation angle, the height of the upper and lower comb fingers have to be as tall as possible. Narrow air gaps between adjacent fingers and tall comb finger heights result in the high aspect ratio geometry between the adjacent comb fingers during the fabrication of the vertical comb drive. This high aspect ratio geometry will make the etching of silicon oxide (a very inert material to typical plasma chemical etching) between the fingers extremely difficult or sometimes impossible, especially when thicker silicon oxide layer is typically required for a good electrical isolation between upper and lower comb fingers in order to achieve the larger rotation mirror angle at higher actuation voltage.

The second obstacle is the routing of the electrical interconnection wires cross the mirror array chip surface to the bonding pads around the chip edges. Each mirror has five electrical actuation electrodes; one is for the electrical ground, two for +/−X rotation and two for +/−Y rotation. In the mirror array structure, the prior art uses the same silicon-silicon oxide-silicon material to make the electrical interconnection wires, mirror structures and vertical comb drive actuators. These electrical wire structures have to be placed in the spaces between the mirrors. When the mirror array is made larger, the number of electrical interconnection wires increases dramatically. It becomes increasingly difficult to accommodate the large amount of electrical wire structures on the space between mirrors, especially for these mirrors close to the chip edge. Therefore, it is difficult for the prior art to achieve larger and higher filling factor mirror array.

SUMMARY

In order to achieve larger micromirror array with a higher filling factor, the micromirrors may use either regular electrical conductive single crystal silicon or the electrical conductive single crystal silicon with trenches refilled with dielectric materials such as silicon oxide, and sometimes also with cavity filling material such as polysilicon etc. The trenches refilled with dielectric materials such as silicon oxide and sometimes also with cavity filling material such as polysilicon are used to electrically isolate but mechanically connect two single crystal silicon pieces.

The presently describe micromirror uses a carrier wafer to make the electrical interconnections structures/wires. The carrier wafer also could be used to provide the part of electrostatic vertical comb drive actuators. The carrier wafer is then bonded with the single crystal silicon used to make the micromirror and micromirror arrays as well as full or part of electrical vertical comb drive actuators. The carrier wafer could be either partial wafer thickness or full wafer thickness TSV (Through Silicon Via) type of wafer, or regular SOI (silicon On Insulator) silicon wafer, or Pyrex type of glass wafer with multiple thin film metal layers used for the electrical interconnections.

Either self alignment silicon etching process or lithography alignment silicon etching process is used to make the vertical comb drive and mirror structures. The smaller air gaps between comb fingers and taller finger height can be therefore easily achieved to have larger mirror rotation angles at much lower actuation voltages. A self alignment silicon etching microfabrication process is used to make electrostatic vertical comb drive actuators on the single layer of electrical conductive single crystal silicon, while lithography alignment silicon etching process is used to make electrostatic vertical comb drive actuators on the two layers of electrical conductive single crystal silicon.

Using the design and process techniques described herein, the high density of electrical interconnections can be easily established for much higher filling factor and larger micromirror arrays.

There is therefore provide, according to an aspect, a micromirror array, comprising an array of micromirrors and a Through Silicon Via (TSV) wafer having electrical connections that extend between a first side and a second side of the TSV wafer. Each micromirror comprises a first stationary structure, a mirror structure connected to a first pivoting structure that pivots the mirror structure relative to the first stationary structure about a first axis of rotation, and a first comb drive pivoting the mirror structure about the first axis of rotation. The first comb drive has a first portion attached to the stationary structure and a second portion attached to the mirror structure. The first portion is electrically isolated from the second portion. The array of micromirrors is mounted to the TSV wafer such that the first and second portions of each comb drive are electrically connected to the electrical connections.

According to another aspect, the first and second portions of the comb drive may be formed from a single wafer. The first and second portions may be electrically isolated by an isolation trench.

According to another aspect, the first and second portions of the comb drive may be formed from separate wafers.

According to another aspect, the first comb drive may comprise a plurality of first and second portions.

According to another aspect, the micromirror array may further comprise a second pivoting structure having a second axis of rotation connecting the mirror structure to a second stationary structure, the first axis of rotation being non-parallel to the second axis of rotation, and a second comb drive pivoting the mirror structure about the second axis of rotation, the second comb drive having a first portion carried by the second stationary structure and a second portion carried by the mirror structure, the first and second portions being electrically connected to electrical connections of the TSV wafer and the first portion being electrically isolated from the second portion.

According to another aspect, the second stationary structure may be stationary relative to the first stationary structure.

According to another aspect, the second stationary structure may be movable with the second portion of the first comb drive.

According to another aspect, the mirror structure may comprise a mirror and a structural frame, and the second portion of the first comb drive may be connected to the frame.

According to another aspect, the TSV wafer may comprise a cavity below the mirror structure, or the electrical connections may comprise posts that suspend the micromirror above the TSV wafer.

According to another aspect, there is provided a micromirror, comprising a support structure and a micromirror structure. A pivot structure connects the support structure to the micromirror structure, the pivot structure having an axis of rotation. A vertical comb drive has a first portion carried by the support structure and a second portion carried by the micromirror structure and electrically isolated from the first portion, such that an electrical potential difference applied to the first portion relative to the second portion drives the mirror about the axis of rotation. Each of the first portion and the second portion comprises comb fingers that extend in a direction, the direction having a component that is parallel to the axis of rotation.

According to another aspect, the direction of the entire comb finger may be parallel to the axis of rotation.

According to another aspect, the fingers are deflected along a radius of curvature that is equivalent to the spacing between the vertical comb drive and the axis of rotation as they extend in a direction parallel to the axis of rotation. The comb fingers may be curved along the radius of curvature. The comb fingers may comprise straight segments that are deflected along one or more tangent to the radius of curvature.

According to another aspect, the comb fingers of the second portion of the comb drive may be set within an outer frame, the outer frame stabilizing the comb fingers.

According to another aspect, the comb fingers of the second portion may be offset between the comb fingers of the second portion in a direction perpendicular to the axis of rotation.

According to another aspect, there is provided a micromirror comprising a first support structure, a second support structure, and a mirror structure comprising a frame and a mirror, the frame circumscribing the mirror. A first pivoting structure has a first axis of rotation and connects the first support structure and the mirror structure. A first comb drive has a first portion connected to the first support structure and a second portion connected to the frame of the mirror structure, the first comb drive rotating the frame about the first axis of rotation. A second pivoting structure has a second axis of rotation and connecting the frame to the mirror. A second comb drive is positioned within the frame, the second comb drive having a first portion connected to the second support structure and a second portion connected to the mirror.

According to another aspect, the first comb drive may be outside the frame relative to the mirror.

According to another aspect, the first comb drive may comprise a plurality of first portions and a plurality of second portions, the first portions being connected to at least two different electrical connections.

According to another aspect the second comb drive may comprise a plurality of first portions and a plurality of second portions, the first portions being connected to at least two different electrical connections.

According to another aspect, the first portion of the first comb drive and the first portion of the second comb drive may be stationary relative to each other.

According to another aspect, the micromirror may be formed from a plurality of layers of material. The first portions of the first and second comb drives may be formed from a first layer of material and the second portions of the first and second comb drives are formed from a second layer of material.

According to another aspect, the micromirror may be formed from a single layer of material.

According to another aspect, there may be provided a Through Silicon Via (TSV) substrate having electrical connections, each of the first and second portions of the first and second comb drives being mounted to a separate electrical connection. The electrical connections may be posts that suspend the micromirror above the TSV substrate or the TSV substrate may comprise a cavity that accommodates rotation of the micromirror about the first and second pivot axes.

According to another aspect, there is provided a pivot hinge for a micromirror, comprising a hinge body having a first side, a second side, a first end connected to a first structure and a second end connected to a second structure, the first structure being pivotable about the hinge body relative to the second structure. Each of the first side and the second side comprises a beam, each beam having a series of discrete, alternating angles between the first end and the second end, the alternating angles causing the hinge body to become progressively narrower moving from the first end to the second end, the first and second sides defining a single aperture within the hinge body.

According to another aspect, the hinge may be symmetrical.

According to another aspect, the beams of the first side and the second side may share a common beam section at the second end of the hinge body.

According to another aspect, the first structure may be a mirror and the second structure may be a support structure.

According to another aspect there is provided a method of manufacturing a MEMS structure having at least a first portion that interacts with a second portion. The method comprising the steps of: etching a first layer with a reference mark and the first portion of the MEMS structure; attaching a second layer to the first layer, the second layer overlying the first layer; etching an opening through the second device layer to reveal the reference mark; and etching the second portion of the MEMS structure in the second layer based on the position of the reference mark.

According to another aspect, the first layer may be mounted to a handle layer, the second layer being attached to an opposite face of the first layer relative to the handle layer. The first layer may be separate from the handle layer by a dielectric layer.

According to another aspect, the first portion is a first set of fingers in a comb drive, and the second portion is a second set of fingers in a comb drive.

According to another aspect, the first portion may be an array of first portions, and the second portion may be an array of second portions.

According to another aspect, the opening may be larger than the reference mark.

According to another aspect, there is provided a comb drive for a micromirror, comprising a stationary structure and a mirror structure. The mirror structure is pivotally connected to the stationary structure by a pivoting structure having an axis of rotation. A comb drive pivots the mirror structure about the axis of rotation, the first comb drive having a first set of comb fingers carried by the stationary structure and a second set of comb fingers carried by the mirror structure. A structural element is spaced from the mirror structure and connects the second set of comb fingers along a portion of a surface of the second set of comb fingers positioned away from the first set of comb fingers. The second set of comb fingers extends outward from the structural element. The first set of comb fingers engages the first set of comb fingers from a direction opposite the structural element.

According to another aspect, there is provided a cantilevered micromirror comprising a mirror structure rotatably mounted to a substrate by a first pivoting structure having a first pivot axis and a second pivoting structure having a second pivot axis. A first comb drive rotates the mirror structure about the first pivot axis and a second comb drive rotates the mirror structure about the second pivot axis. Each of the first and second comb drives comprises a fixed portion and a movable portion, the fixed portion of each comb drive being stationary relative to the substrate. The second comb drive is disposed between the first comb drive and the mirror structure, the first comb drive, the second comb drive and the mirror structure being disposed along the first pivot axis.

According to another aspect, each of the first and second pivoting structures are connected between the mirror structure and anchor points that are stationary relative to the substrate. Each anchor point may be an electrical connection. Alternatively, at least one anchor point may be electrically connected to the fixed portion of the second comb drive.

According to another aspect, the substrate may be a Through Silicon Via (TSV) substrate comprising electrical connections, at least one electrical connection connecting directly to the fixed portion of the second comb drive.

These and other aspects will become apparent from a review of the description and claims that follow, with reference to the drawings.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 20*a* through 20*g* depicts a process flow to make the micromirror, vertical comb drive actuators.

DETAILED DESCRIPTION

Figure 1A:
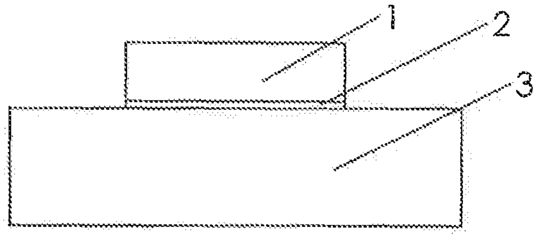
Fig. 1a (Prior Art)
FIG. 1*a* through 1*e* depict a typical process flow of a prior art to make vertical comb drive actuator.
Figure 1B:
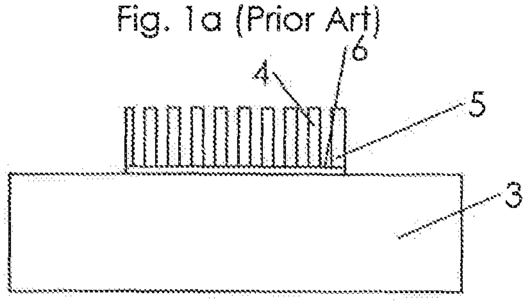
Fig. 1b (Prior Art)
Figure 1C:
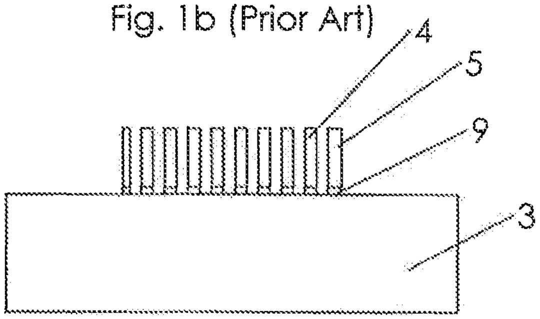
Fig. 1c (Prior Art)
Figure 1D:
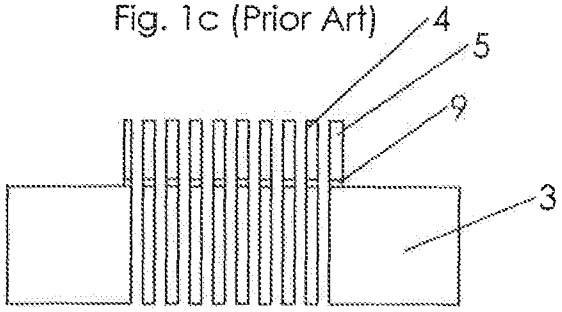
Fig. 1d (Prior Art)
Figure 1E:
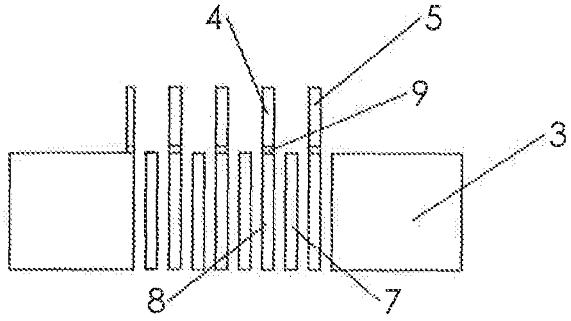
Fig. 1e (Prior Art)

While micromirrors and processes described herein are susceptible of embodiments in many different forms, there are shown in the drawings and will herein be described in detail, preferred embodiments with the understanding that the present disclosure is to be considered as an exemplification of the principles of the device and is not intended to limit the broad aspects of the device to the embodiments illustrated. The figures are not necessarily drawn to scale and relative sizes of various elements in the structures may be different than in an actual device.

As depicted and described herein, comb drives are preferably symmetrical about the respective pivot axis, or in other words, each comb drive that is used to pivot a mirror about an axis is preferably made up of two or more separate sets of combs. Preferably, the user has the option of applying a different voltage difference to each set of combs, such that the mirror may be pivoted in opposite directions, depending on the voltage difference that is applied. In other designs, the different sets of combs may work together to increase the pivoting force applied to the mirror. In yet other designs, a comb drive may be made up of only one set of combs, or the different sets of combs may not be symmetrical about the pivot axis. In the examples described herein and in the claims that follow, it will be understood that a reference to a comb drive that tilts a mirror about an axis does not exclude the possibility that the comb drive is made up of a plurality of sets of combs that may be separated, and that may be used together or separately to control the position of the mirror.

Micromirrors and micromirror arrays using vertical comb drive electrostatic actuators are disclosed in a number of patents, including U.S. Pat. No. 7,734,127 (Korevaar et al.) entitled "Optical switch module"; U.S. Pat. No. 7,386,201 (DiRuscio et al.) entitled "Mems mirror array and controls"; U.S. Pat. No. 6,881,649 (Kouma et al.) entitled "Method of making device chips collectively from common material substrate" and U.S. Pat. No. 6,822,776 (Hah et al.) entitled "Scanning micromirror for optical communication systems and method of manufacturing the same". A brief discussion of manufacturing steps commonly used in the prior art will now be given with reference to FIG. 1*a*-1*e*, labeled "prior art". This discussion is given for the purpose of giving some context to the further discussion below, but without limitation to the discussion that will follow.

The material chosen and microfabrication method for the vertical comb drive actuator is shown in FIG. 1*a*-FIG. 1*e*. A Silicon-Silicon Oxide-Silicon material (shown in FIG. 1*a*) is used to make micromirror, electrical interconnection wires and vertical comb drive actuators. A dielectric material 2 such as silicon oxide is used to electrically isolate the conductive silicon layer 1 and conductive silicon layer 3 (shown in FIG. 1*a*). First, lithography and silicon DRIE (Deep Reactive-Ion Etching) are used to etch the silicon layer 1 (shown in FIG. 1*b*). The silicon oxide layer 2 is an excellent etching stop material to silicon DRIE to prevent the further silicon etching into silicon layer 3. The thickness of the silicon oxide layer is typically over a couple of microns in order to withstand an electrical voltage applied between silicon layer 1 and 3 that may be over a couple of hundred volts. The air gap between finger 4 and 5 is made as small as possible in order to have higher energy density (shown FIG. 1*b*), and the height of the finger 4 and 5 is made as tall as possible to have a larger angle of rotation for the mirror. All these requirements result in the high aspect ratio geometry between fingers 4 and 5. Etching the silicon oxide 6 between fingers 4 and 5 becomes extremely difficult or impossible for a silicon oxide thickness of over a couple of microns (shown in FIG. 1*c*). Excessive silicon etching on the lower part of finger 4 and 5, such as the DRIE footing phenomenon, could also happen due to the long DRIE and the electrical charging of silicon oxide layer during DRIE. After the silicon DRIE of silicon layer 3 is performed (shown FIG. 1*d*), some upper comb fingers are selectively etched away (shown in FIG. 1*e*). Electrostatic force occurs between lower finger 7 and upper fingers 4 and 5 when an electrical potential is applied between silicon layer 1 and 3. The silicon oxide 9 between the upper finger 4 and lower finger 8 is kept to have better electrical isolation between silicon layer 1 and 3. If the silicon oxide 9 is removed using wet oxide etchant, then the electrical isolation will be compromised from the small particles or chemical residues stuck within the space between the upper finger 4 and lower finger 8.

Since the prior art also use the same silicon-silicon oxide-silicon material (shown in FIG. 1*a*) to make not only the micromirror and vertical comb drive actuators but also the electrical interconnection silicon wires, it becomes difficult to have high filling factor mirror array. The electrical interconnection silicon wires on the silicon layer 1 and 3 are running through the space between micromirrors shown in FIGS. 8*a* and 8*b* of U.S. Pat. Nos. 7,734,127, and 7,386,201. When the mirror array becomes larger, the number of electrical interconnection silicon wires increases dramatically, and it becomes difficult or sometimes impossible to use such electrical connection methods to form a larger micromirror array with high filling factor. One reason is that there is not enough space between micromirrors, especially for the mirrors close to the chip edges, to accommodate the increasing silicon wires required for the larger micromirror array. Another reason is that the chip strength becomes very fragile due to the silicon layer 1 and 3 are truncated by these highly dense electrical silicon wires. In addition, the arrangement of the electrical silicon wires on silicon layer 1 and 3 becomes impossible for the larger micromirror array with high filling factor, as any routing of the silicon wires on silicon layer 1 has to protect the silicon wires on silicon layer 3, otherwise, the silicon DRIE (FIG. 1*d*) will etch away the silicon wires on the silicon layer 3.

Figure 2A:
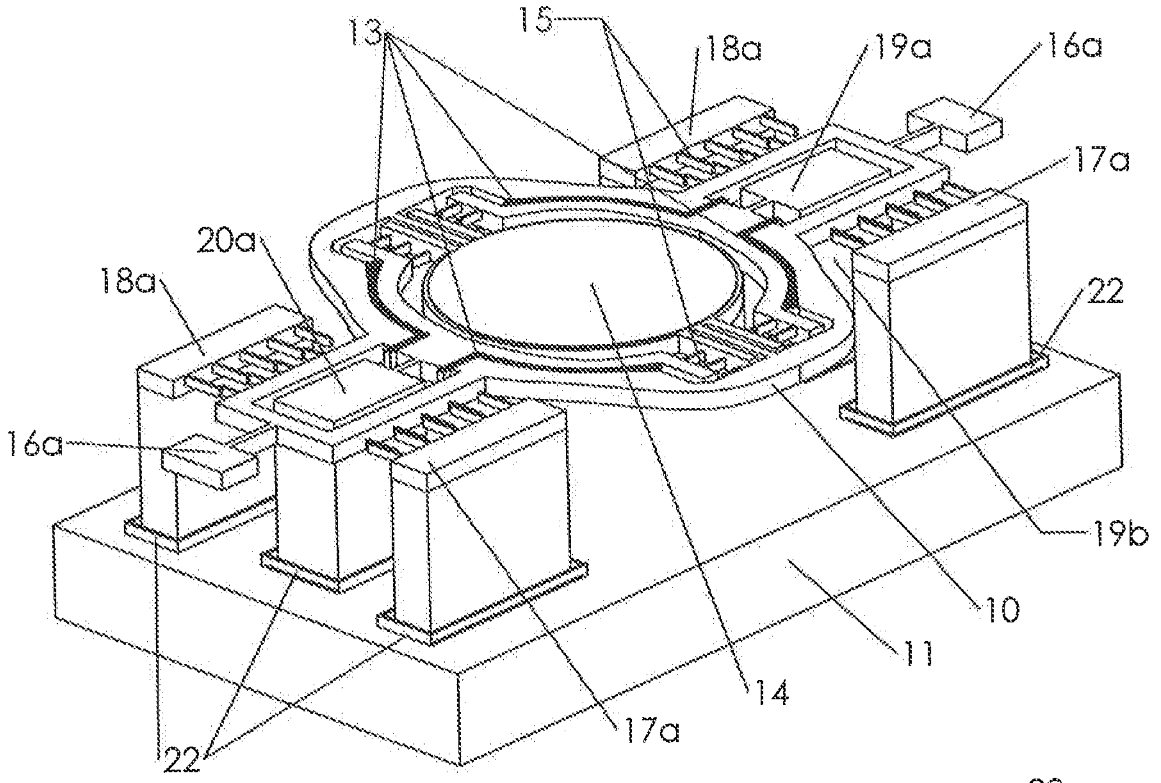
FIGS. 2*a* and 2*b* are perspective views of a micromirror, vertical comb drive actuators and carrier wafer.
Figure 2B:
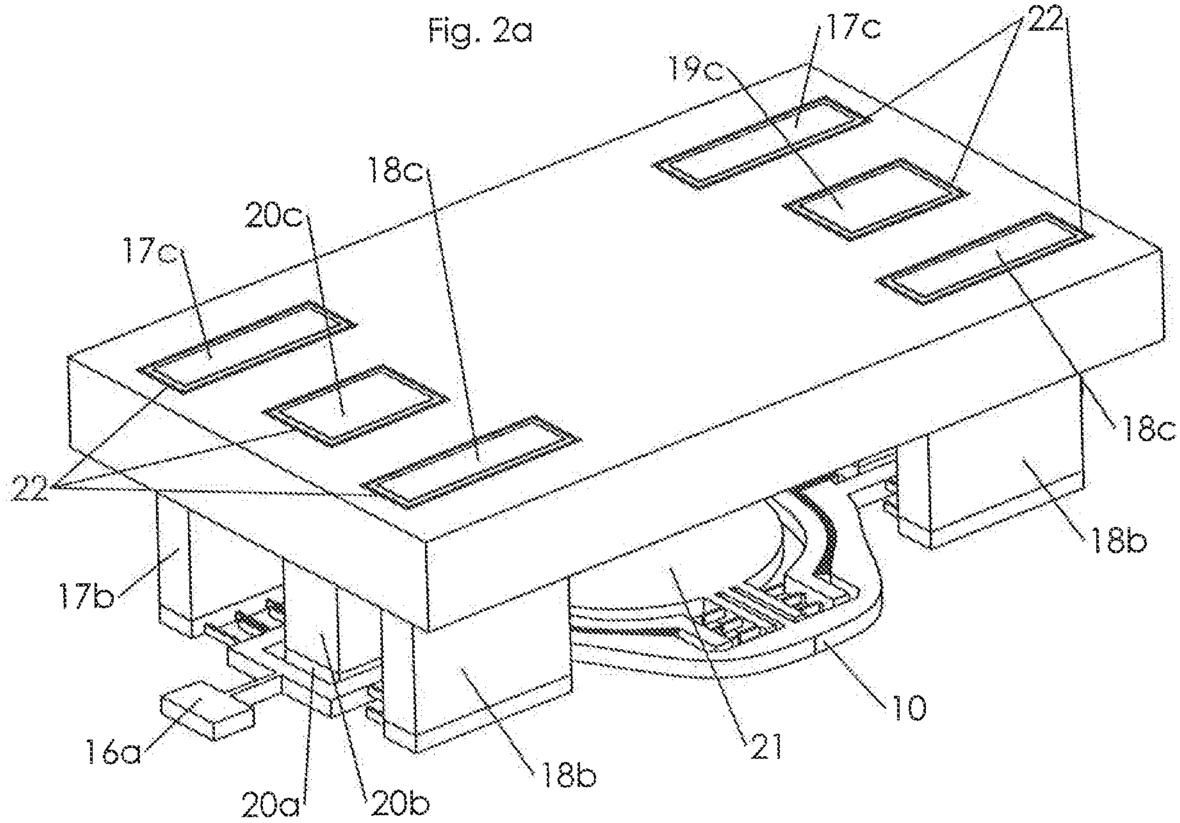

Referring to FIGS. 2*a* and 2*b*, according to one design described herein, a micromirror and by extension a micromirror array may be made from a single layer of electrical conductive single crystal silicon 10 with trenches 13 refilled with dielectric materials such as silicon oxide, and sometimes also with cavity filling material such as polysilicon to make both the micromirror 21 and micromirror array and electrical vertical comb drive actuators 15, (shown in FIG. 2*a*). The trenches 13 refilled with dielectric materials are used to electrically isolate the three electrical actuation electrodes 16*a*, 19*a* and 20*a*) for each micromirror with 2 dimensional rotations. The trenches also mechanically join these electrodes together. A self-alignment microfabrication is preferably used to make electrostatic vertical comb drive actuators on the single layer of electrical conductive single crystal silicon 10, which allows smaller air gaps between comb fingers and taller finger height for larger mirror rotation angles at lower actuation voltages to be more easily achieved.

This design preferably uses a carrier wafer 11 (shown in FIG. 2*a* and FIG. 2*b*) for the routing of electrical interconnections. The carrier wafer could be either partial wafer thickness or full wafer thickness TSV (Through Silicon Via) type of wafers, or glass (such as Pyrex) wafer with multiple thin film metal layers used for the dense electrical interconnections. TSV type of carrier wafer 11 is shown in FIG. 2*a* and FIG. 2*b*. The carrier wafer 11 has electrical conductive silicon via or posts 17*b*, 18*b*, 19*b* and 20*b* (shown in FIG. 2*a* and FIG. 2*b*). Each silicon via or post is surrounded by a trench 22 refilled with dielectric material such as silicon oxide, sometimes also with cavity filling material such as polysilicon to provide the electrical isolation.

In the depicted embodiment, the carrier wafer 11 is bonded with the single layer of conductive single crystal silicon 10. The electrical interconnections are established vertically to the bottom metal bonding pads 17*c*, 18*c*, 19*c* and 20*c* through the electrode 17*a*, 18*a*, 19*a* and 20*a* and the silicon via or post 17*b*, 18*b*, 19*b* and 20*b*. Using this approach, the high density of electrical interconnections can be easily established for the very large micromirror arrays with a higher filling factor.

An example of the major microfabrication steps that may be used arrive at the depicted embodiment is shown in FIG. 3*a*-3*m*, and described below.

Figure 3A:
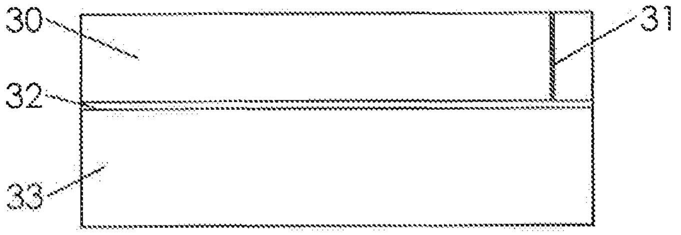
FIG. 3*a* through 3*m* depict a process flow to make the micromirror, vertical comb drive actuators and carrier wafer.
Figure 3B:
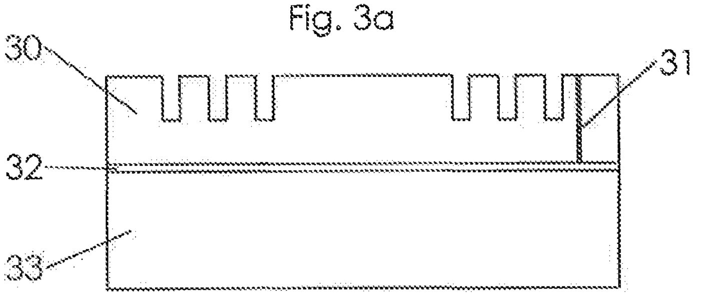

A self-alignment silicon etching microfabrication process may be used to make the electrostatic vertical comb drive actuators on the single layer of electrical conductive single crystal silicon 30 (shown in FIG. 3*a*). FIG. 3*a* shows the starting material for both micromirror and vertical comb drive actuators. A layer of electrical conductive single crystal device silicon 30 has silicon etched trench 31 refilled with dielectric materials such as silicon oxide, and sometimes also with cavity filling material such as polysilicon. Silicon 30, Buried Oxide (BOX) layer 32 and handle silicon wafer 33 form a typical SOI (Silicon On Insulator) wafer. The starting SOI wafer with trenching and refilled device silicon layer, which may also be referred to as a silicon layer with isolation trenches, can be either made in house or custom made by silicon wafer vendors. Silicon DRIE may subsequently performed to etch about half thickness of the silicon layer 30 (shown in FIG. 3*b*) for the purposes of the mirror weight reduction and/or flexible hinge height reduction etc.

Figure 3C:
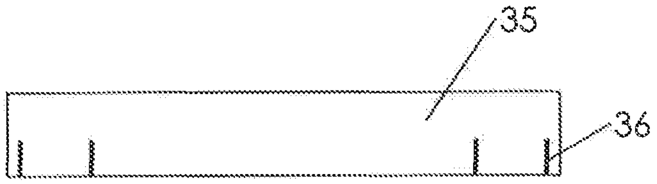
Figure 3D:
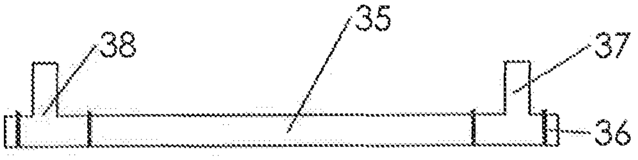

FIG. 3*c* shows the starting material for making the carrier wafer. A conductive single crystal silicon wafer 35 has silicon etched trenches 36 refilled with dielectric materials such as silicon oxide, and sometimes also with cavity filling material such as polysilicon. The trenches are typically not all the way through the full thickness of wafer 35, the trenching 36 depth is determined by the specific design requirements of the micromirror and micromirror array, for example, the trenching depth could be ⅔ of the wafer thickness. Again this starting material can be either made in house or custom made by silicon wafer vendors. A silicon DRIE is subsequently performed from the wafer top surface to reach the trenches 36 (shown in FIG. 3*d*) so that silicon via or post 37 and 38 are electrically isolated.

Figure 3E:
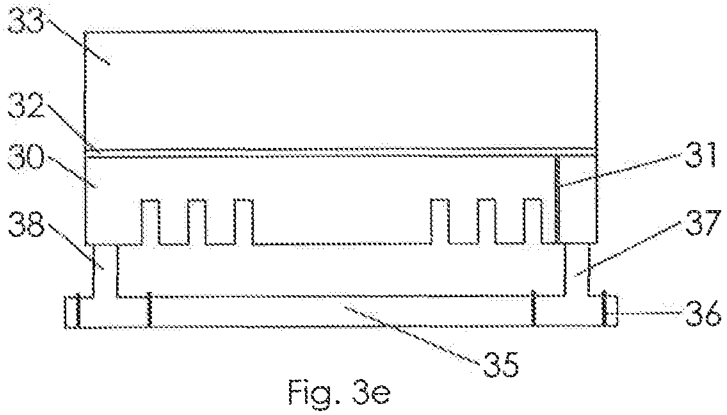
Figure 3F:
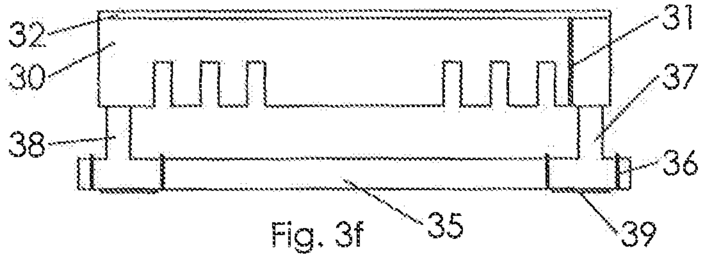
Figure 3G:
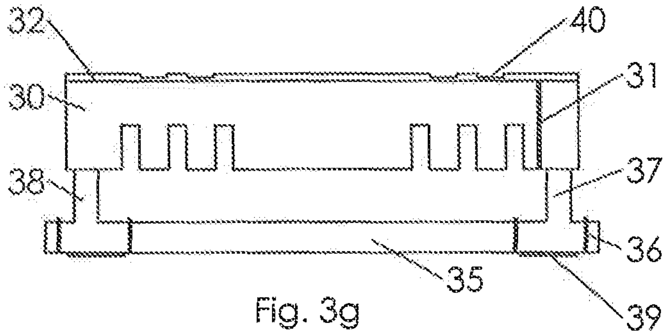
Figure 3H:
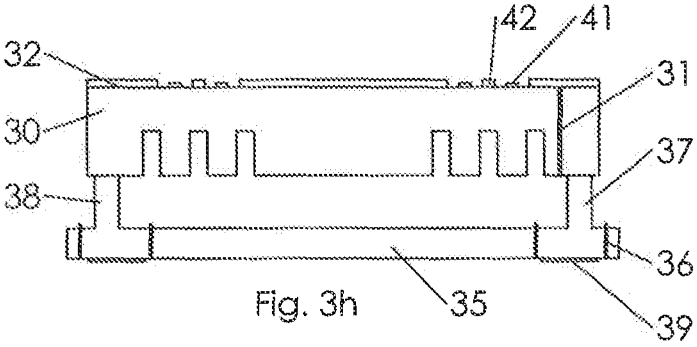

FIG. 3*e* shows the wafer bonding of wafer 30 and carrier wafer 35. FIG. 3*f* shows the etching away of the handle wafer 33. Before or after etching away of the handle wafer 33, the thin film metal bonding pads 39 can be made on the back side of wafer 35. These bonding pads can be used for solder balls or wired bonding.

Partial silicon oxide etching is performed on the silicon oxide layer 32 in the place 40 where the lower comb finger will be located. Typically half of the silicon oxide layer 32 thickness is etched away. And then lithography step and silicon oxide etching are conducted to prepare the silicon oxide DRIE etching mask for upper and lower fingers as well as other features such as mirror structures, hinges and electrodes etc. The oxide mask 42 for upper comb finger is thicker than the oxide mask 41 for lower comb finger (shown in FIG. 3*h*).

Figure 3I:
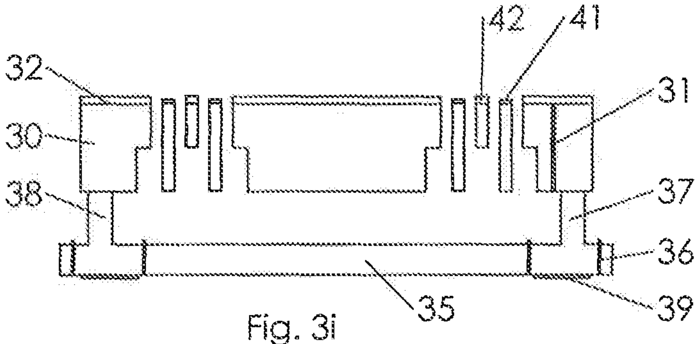
Figure 3J:
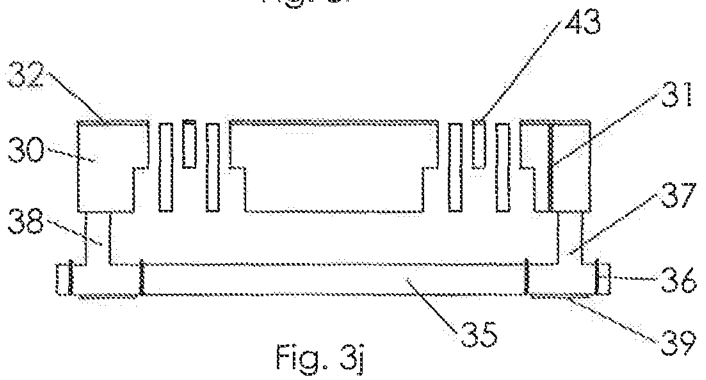
Figure 3K:
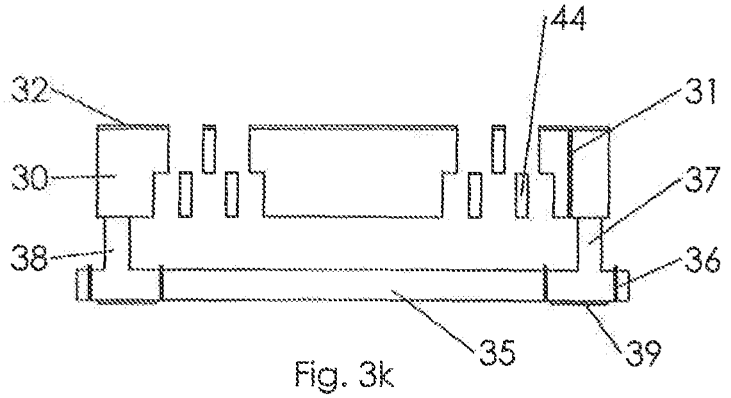
Figure 3L:
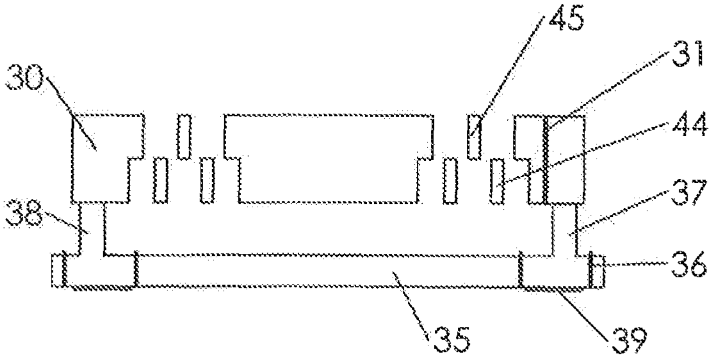
Figure 3M:
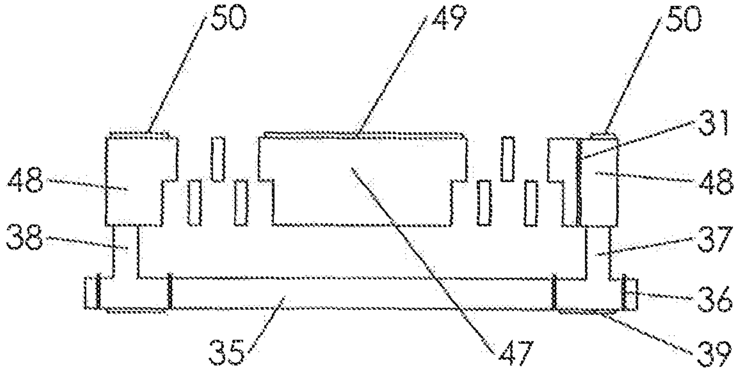

The first silicon DRIE etches through the silicon 30 to form the upper comb fingers and partially finished lower comb fingers (shown in FIG. 3*i*). An oxide RIE (Reactive Ion Etching) etches away the thinner oxide mask 41 while the thicker oxide mask layer still remain in the areas for example oxide mask layer 43 on the top of upper comb finger (shown in FIG. 3*j*). The second silicon DRIE etches the half thickness of the silicon layer 30 to form the lower comb finger 44 (shown in FIG. 3*k*). The upper comb finger 45 and lower comb finger 44 are finished after removal of the oxide layer 32 using oxide RIE (shown in FIG. 3*l*). The optical reflective thin film 49 such as Au thin film and thin film electrode metal 50 can be placed on the top of mirror structure 47 and electrode 48 respectively using metal PVD (Physical Vapor Deposition) such as sputtering with a shadow mask (shown in FIG. 3*m*). The mirror metal 49 and bonding pad metal 50 can be also deposited, patterned and protected before the first DRIE (shown in FIG. 3*j*).

Figure 4:
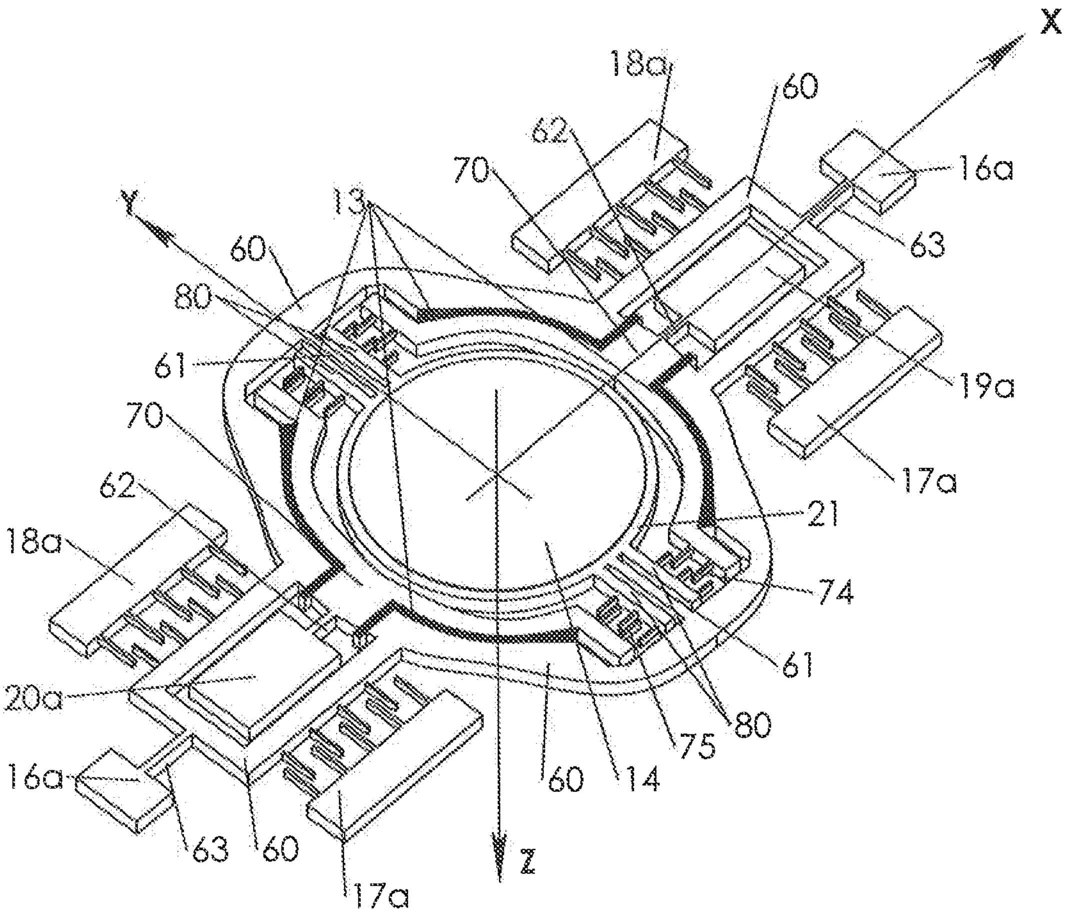
FIG. 4 is a perspective detailed view of a micromirror, vertical comb drive actuators.

The detailed view of the micromirror with vertical comb drive actuators is shown in FIG. 4. The trenches 13 refilled with dielectric materials such as silicon oxide, and sometimes also with cavity filling material such as polysilicon electrically isolate the mirror supporting frame 60 from the silicon connection regions 70. The silicon connection regions 70 form the electrical paths and mechanical supporting structures for the fixed vertical comb drive fingers 74 and 75. The comb fingers 74 and 75 on the silicon connection regions 70 are electrically connected to the fixed electrode 19*a* and 20*a* respectively through silicon connection regions 70 and silicon hinge 62.

The mirror 21 with its comb fingers and optical reflective coating 14, the mirror supporting frame 60 with its comb fingers and electrodes 16*a* are mechanically and electrically connected through the silicon hinges 61 and 63 (shown in FIG. 4).

The electrodes 16*a*, 17*a*, 18*a*, 19*a* and 20*a* are mechanically fixed to the vias or posts of the carrier wafer. Both the mirror 21 and mirror supporting frame 60 can be actuated to have the first dimensional rotation along X axis/the hinges 62 and 63, and mirror 21 can also be actuated to have the second dimensional rotation along Y axis/the hinge 61 (shown in FIG. 4). Hinges 61, 62 and 63 are part of what may be referred to as a pivoting structure, and are connected between anchors and the micromirror structure. The anchors may be fixed to a substrate, or may be the moving portion of the micromirror, where the particular hinge pivots relative to that moving portion. In this case, the moving portion may be considered a stationary structure for the purposes of pivoting the mirror about a second pivot axis. The term micromirror structure is intended to include components such as mirror 21 and mirror supporting frame 60 in this example. Depending on the particular micromirror design, the term may also be used to include other components that will be recognized by those skilled in the art, or may be used to simply refer to mirror 21. In micromirror designs with two pivot axis, it is preferable to design the pivot axes that are perpendicular, as this generally simplifies operation of the micromirror. However, it is also possible to design the pivot axes at angles that are not perpendicular, with the understanding that, to achieve pivoting in two dimensions, the pivot axes must be non-parallel.

If the electrical ground is applied to the fixed electrode 16*a*, and an electrical potential is applied to the fixed electrodes 18*a*, the electrostatic force resulting in between the fixed upper comb fingers on the fixed electrodes 18*a* and lower comb fingers on the mirror supporting frame 60 will actuate the mirror supporting frame 60 with mirror 21 clockwise about the axis X (shown in FIG. 4).

If the electrical ground is applied to the fixed electrode 16*a*, and an electrical potential is applied to the fixed electrodes 17*a*, the electrostatic force resulting in between the fixed upper comb fingers on the fixed electrodes 17*a* and lower comb fingers on the mirror supporting frame 60 will actuate the mirror supporting frame 60 with mirror 21 counterclockwise about the axis X (shown in FIG. 4).

If the electrical ground is applied to the fixed electrode 16*a*, and an electrical potential is applied to the fixed electrodes 19*a*, the electrostatic force resulting in between the fixed upper comb fingers on the silicon regions 70 and lower comb fingers on the extension arms 80 from the mirror 21 will actuate the mirror 21 counterclockwise about the axis Y (shown in FIG. 4).

If the electrical ground is applied to the fixed electrode 16*a*, and an electrical potential is applied on the fixed electrodes 20*a*, the electrostatic force resulting in between the fixed upper comb fingers on the silicon regions 70 and lower comb fingers on the extension arms 80 from the mirror 21 will actuate the mirror 21 clockwise about the Y axis (shown in FIG. 4).

Figure 5A:
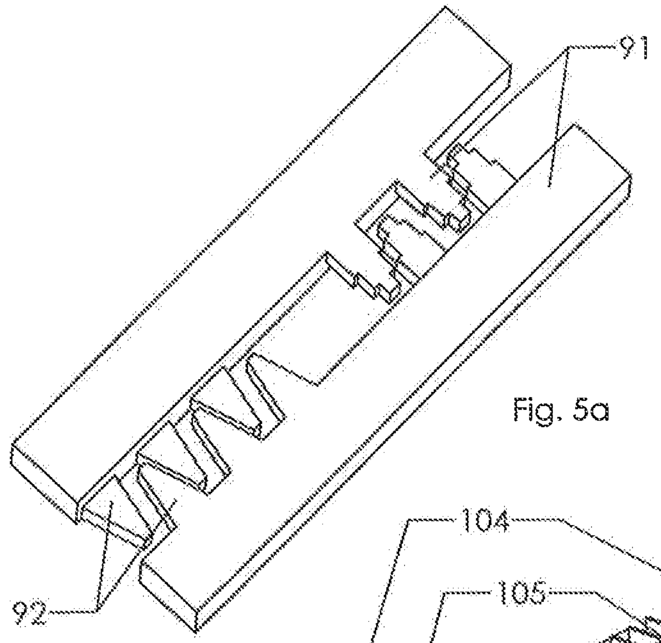
FIGS. 5*a* and 5*b* are perspective views of comb finger shapes.

In order to increase the comb finger mechanical strength, a comb finger with different shapes, such as stepped shape 91 and taper shape 92 (shown in FIG. 5*a*) may be used.

Figure 5B:
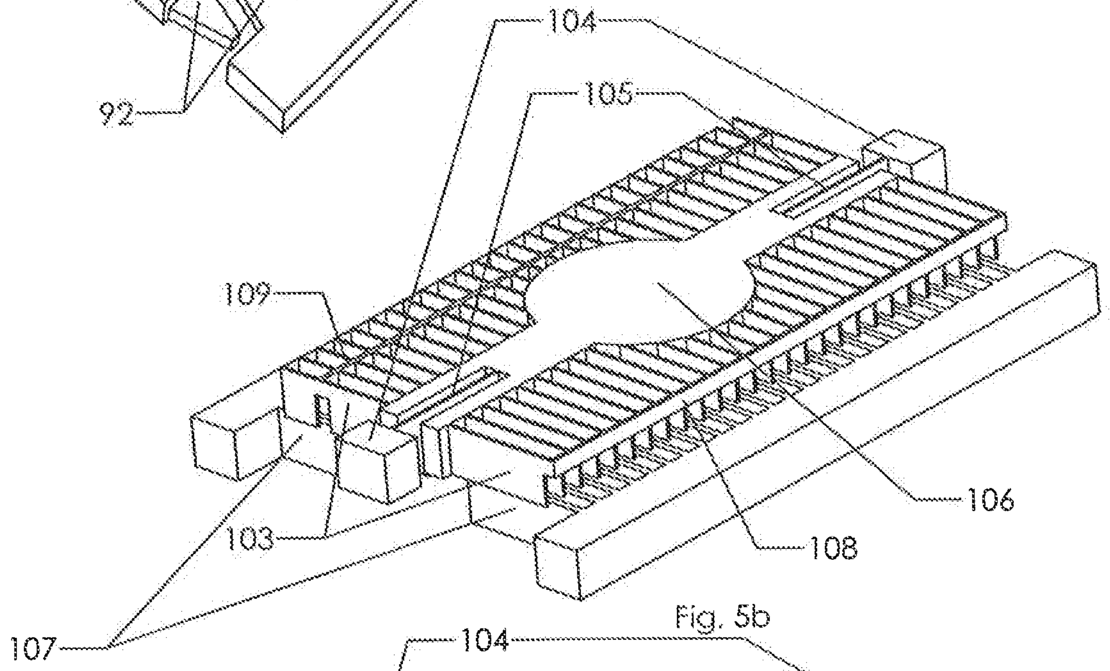

FIG. 5*b* shows another method to strengthen the mechanical strength of comb fingers. The fixed anchors 104 are attached to the hinges 105 of the structure 106 such as, rotation axis shaft, mirror, etc. The vertical comb drive actuator includes fixed lower comb fingers 107. In order to maximize the actuation power of the vertical actuators, the effective strategy would be to increase the finger density, i.e., to reduce the comb finger pitches between adjacent two moveable fingers and/or adjacent two moveable fingers, and increase the interactive length between fixed and moveable fingers. The thin and long moveable comb fingers 103 are used to increase the actuation power of the actuators. However, the thin and long moveable comb fingers have weak mechanical strength which will increase the likelihood of device malfunctions such as electrical shorting between fixed fingers and moveable fingers due to undesired bend of movable fingers. In order to avoid these difficulties, structural beams 108 and 109 (shown in FIG. 5*b*) may be provided to prevent the moveable fingers from unintentionally bending. The position of the strengthening beam may vary, but is generally spaced from the mirror structure, and connects the movable fingers 103 together along at least a portion of the top surface of the movable fingers 103 such that the movable fingers 103 extend downward from the structural element 108 and 109. This is required to allow the comb drive to operate, as the fixed fingers 107 traverse the structural elements 108 and 109. In this case, as directions are relative, "top surface" is defined relative to the fixed fingers 107, which are "below" the movable fingers 103. For example, it could be provided at the tip of the movable fingers, such as beam 108, or may be spaced a certain distance from the fingertip, such as the beam 109. The material of the strengthening beam is preferably single crystal silicon shown in FIG. 5*b*. The height and width of the beam may be relatively small. The silicon beam structure 108 and 109 may be fabricated using the process flow shown in FIG. 3*a*-3*m*, but other beam materials and similar structure to achieve the same functions could be easily made to the experts in the field.

Figure 5C:
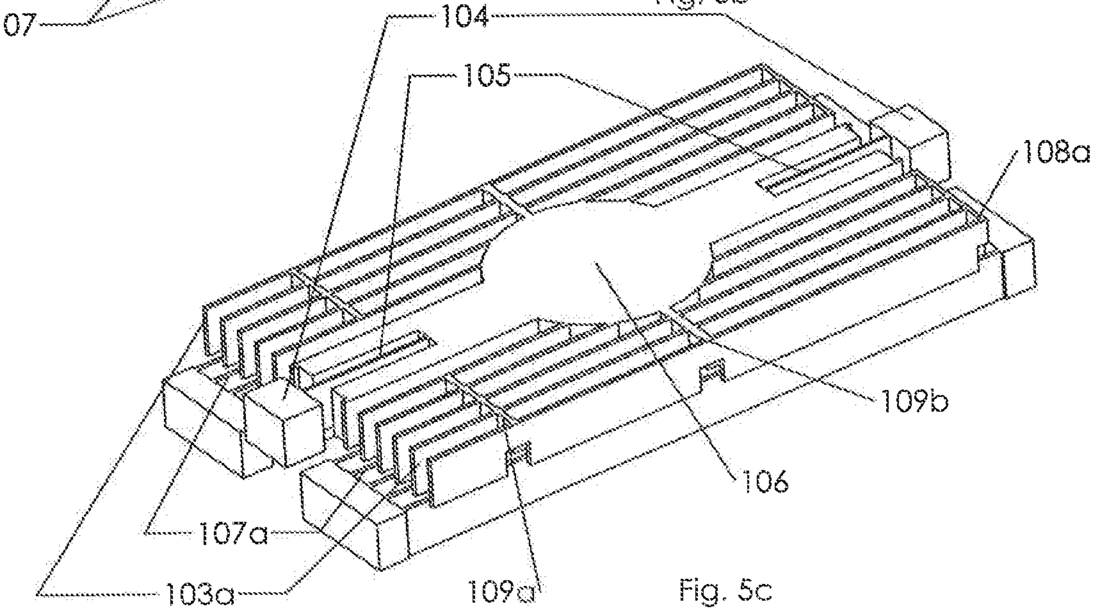
FIG. 5*c* is a perspective view of a tilting mirror having fingers parallel to the axis of rotation.

FIG. 5*c* shows design variations of the strengthening beams of comb drive fingers for the mirror structure. The orientation of moveable comb finger 103*a* and fixed comb finger 107*a* is parallel to the rotation hinge 105. The strengthening beams 108*a*, 109*a* and 109*b* are used to strength the movable comb fingers 103*a*.

Figure 6:
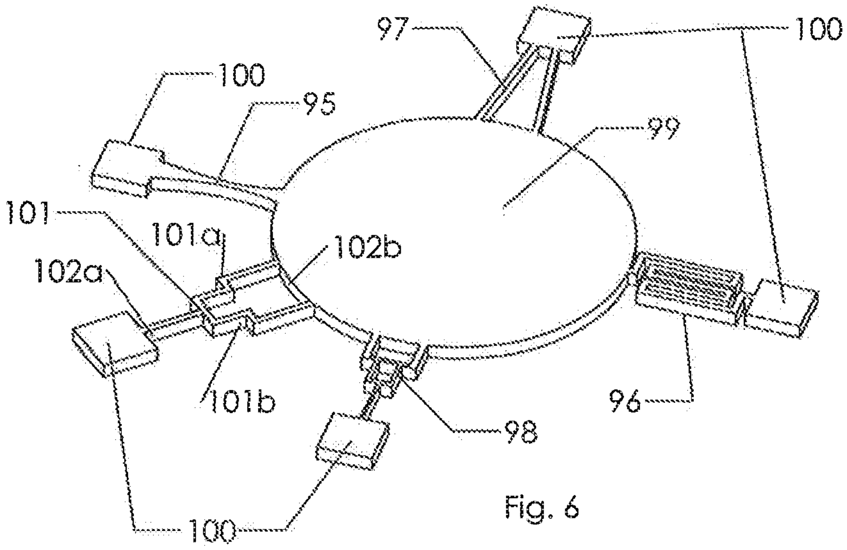
FIG. 6 is a perspective view of hinges shapes.

Referring to FIG. 6, various possible hinge shapes are shown. The depicted examples include a taper shape 95, a serpentine shape 96, a V shape 97, a multiple stepped parallel arm shape 101, and a connected multiple stepped parallel arm shape 98. Other designs may also be used, as will be recognized by those skilled in the art. These shapes may be used to increase the design and micro fabrication flexibilities. The hinges are used to connect the movable structure 99, such as mirror supporting frame or mirror, to the fixed or relative fixed part 100 such as fixed electrodes or the mirror supporting frame. As fixed part 100 may be part of a movable portion itself, it will be understood that it may be considered fixed relative to the movable structure 99.

A preferred hinge design is indicated by reference numeral 101. This hinge has a first side 101*a*, a second side 101*b*, a first end 102*a* connected to a movable structure, such as a mirror 99 as shown, and a second end 102*b* connected to a fixed structure, such as an anchor 100 as shown. Each of the first side 101*a* and the second side 101*b* is made up of a beam with a series of discrete, alternating angles between the first end 102*a* and the second end 102*b*. Preferably, there will be at least two or more sets of symmetrical, alternating angles that terminate in a common beam to the anchor 100. The alternating angles causing the hinge body to become progressively narrower moving from the first end to the second end. As can be seen, the first and second sides defining a single aperture within the hinge body. This may be contrasted with hinge 98, which defines multiple apertures in its shape.

Figure 7:
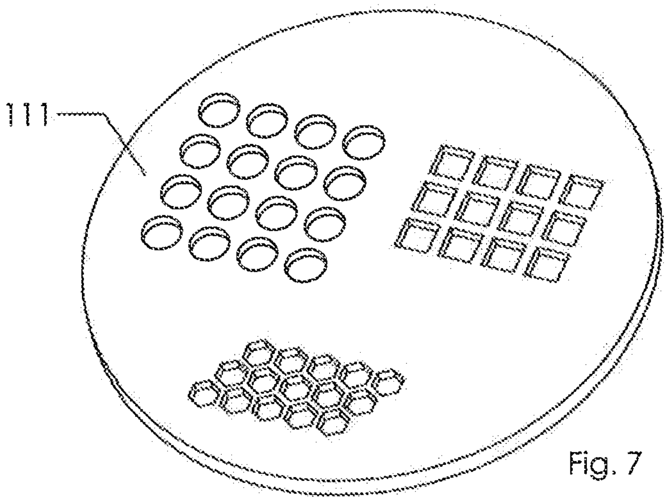
FIG. 7 is a perspective view of cavity shapes etched on the mirror backside.

The back side of the mirror 111 may be partially etched away to reduce the mechanical mass in order to increase its mechanical response speed and anti-shock ability by reducing the inertia force in the vibration and shock environments. Examples of circular, square and hexagon etching geometries are shown in FIG. 7. Other geometries known to those skilled in the art may also be used.

Figure 8:
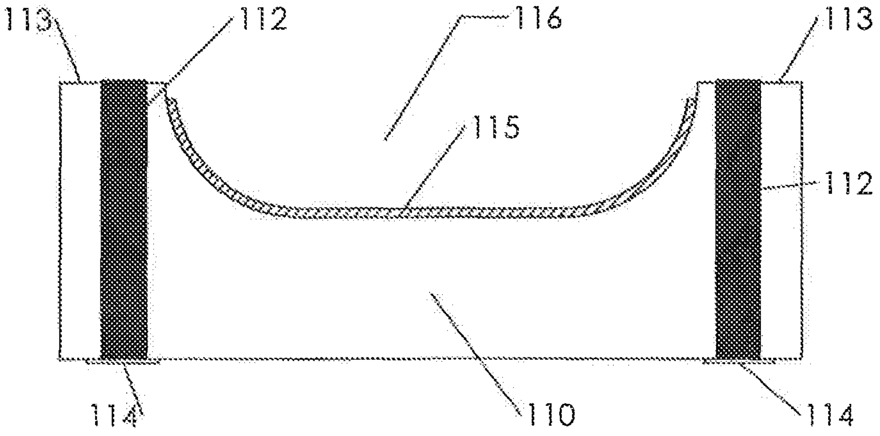
FIG. 8 is a perspective view of glass based TSV type of carrier wafer.

Besides the silicon based TSV carrier wafer, a glass based TSV type of carrier wafer may also be used. Referring to FIG. 8, the depicted glass wafer 110 has via holes filled with metal 112 used for the electrical interconnections. The glass wafer 110 can be any glass material, including Pyrex which allows anodic bonding. The top surface of the metal 112 is preferably slightly higher than the glass wafer top surface 113 for easy electrical connection with the bottom surfaces of bonded conductive silicon electrodes 16*a*, 17*a*, 18*a*, 19*a* and 20*a* shown in FIGS. 2*a*, 2*b* and 4. Referring again to FIG. 8, a metal film 114 may be included for wire bonding or for solder balls. A cavity 116 on the glass wafer 110 is etched to provide spaces for the rotations of the mirrors and mirror supporting frames. A thin metal film is deposited and patterned on the cavity surface to provide an electrical ground surface to shield the electrical charges from the glass wafer 110.

Figure 9:
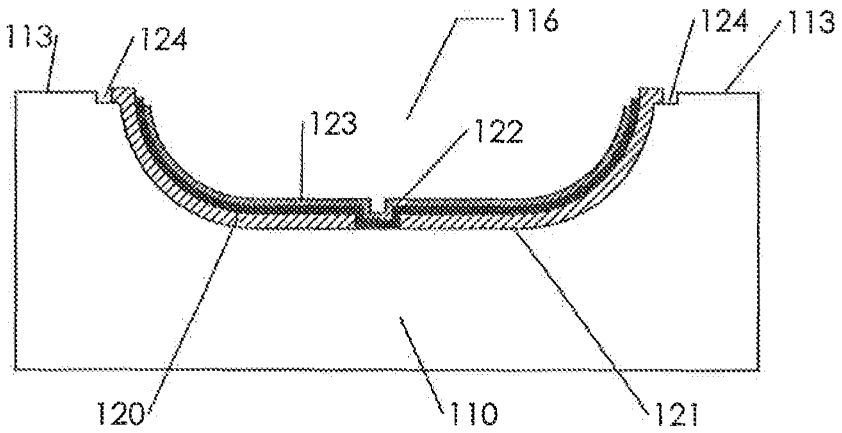
FIG. 9 is a perspective view of glass based carrier wafer.

Referring to FIG. 9, the glass based carrier wafer can use multiple thin metal layers for the electrical interconnections. The glass wafer 110 is etched with a shallow cavity 124 and a deep cavity 116 to accommodate the metal electrical interconnection wires 120 and 121. The top surfaces of the metal wires 120 and 121 are preferably slightly higher than the glass surface 113 for easy electrical connection with the bottom surfaces of bonded conductive silicon electrodes 16*a*, 17*a*, 18*a*, 19*a* and 20*a*, shown in FIGS. 2*a*, 2*b* and 4. Referring again to FIG. 9, a thin layer of dielectric material such as silicon oxide or silicon nitride 122 is deposited and patterned on the metal 120 and 121. And then a thin metal film 123 is deposited and patterned on the dielectric material 122 to provide an electrical ground surface to shield the electrical charges from dielectric material 122, and also the electrical interferences from the wires 120 and 121. Extra interconnection metal layers and dielectric material layers can be added as described to increase the capacity of the electrical interconnections.

Figure 10:
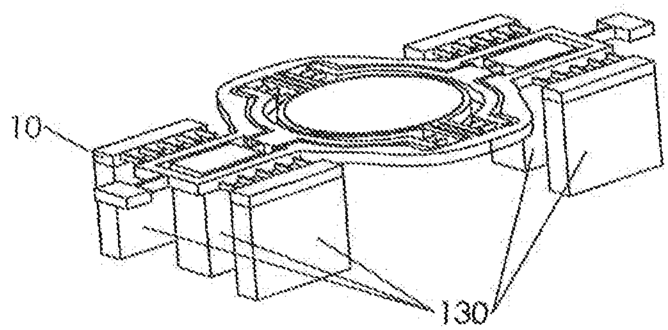
FIG. 10 is a perspective view of a micromirror, vertical comb drive actuators with electrical and mechanical posts.
Figure 11:
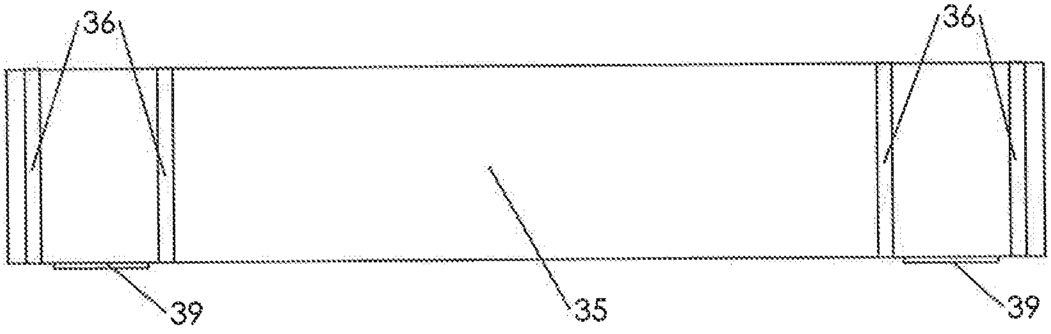
FIG. 11 is a view of a flat silicon carrier wafer with TSV.

The mechanical support and electrical connectors, via/posts, which are used to connect to a micromirror, such as a micromirror, shown in FIGS. 2*a*, 2*b* and 4, may also be made with the mirror and actuator wafer 10, as shown in FIG. 10. The fabrication of the posts 130 will be obvious to the expert in the field. If the mirror and actuator wafer 10 with posts 130 is used, the carrier wafer may be flat silicon or glass based TSV carrier wafer. The flat silicon based TSV carrier wafer is shown in FIG. 11, where a trench 36 is refilled with dielectric materials on silicon wafer 35, which may be used to electrically isolate bonding pad metal 39 on the wafer. The flat glass carrier wafer with TSV or with multiple thin films metal layers is shown in FIGS. 12 and 13 respectively.

Figure 12:
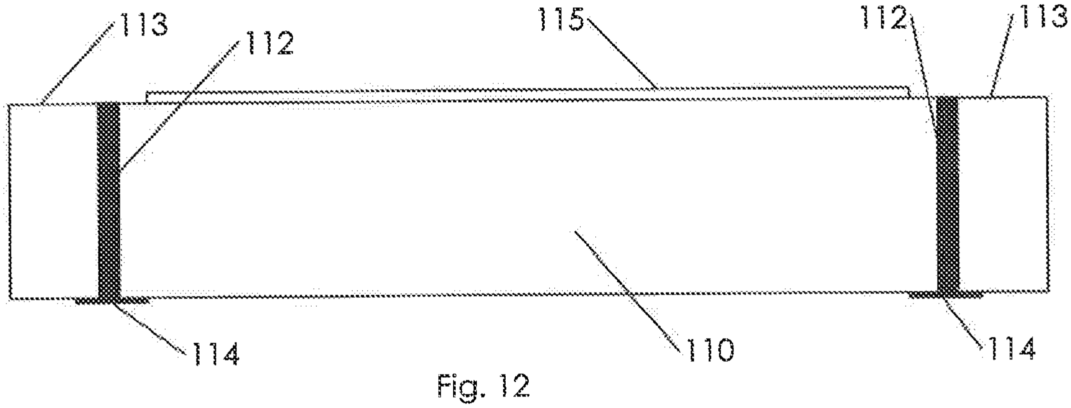
FIG. 12 is a view of a flat glass TSV type of carrier wafer.

Referring to FIG. 12, there is shown a glass wafer 110 with metal vias 112, an electrical ground metal film 115 that is used to shield the electrical charges from the glass wafer 110, and bonding pad metal 114. The top surfaces of the metal vias 112 are preferably slightly higher than the glass surface 113 for easy electrical connection with the bottom surfaces of bonded conductive silicon electrodes.

Figure 13:
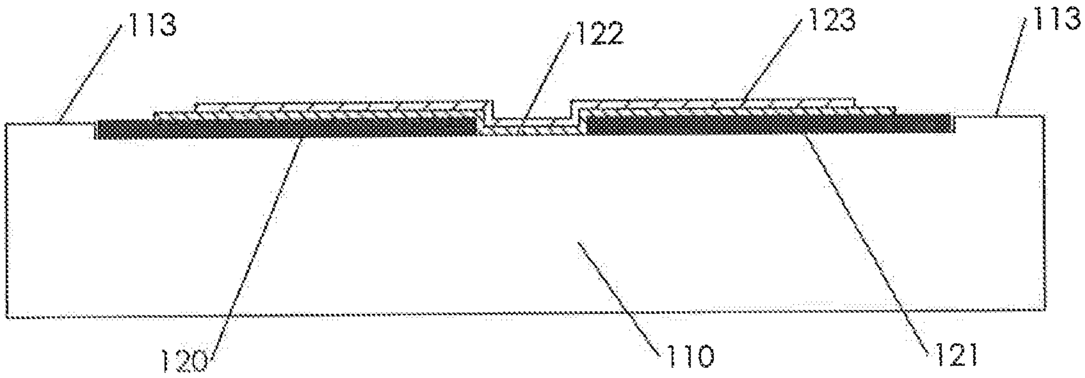
FIG. 13 is a view of a flat glass carrier wafer with multiple metal film layers.

In FIG. 13, the top surfaces of the metal wires 120 and 121 are shown to be slightly higher than the glass surface 113 for easy electrical connection with the bottom surfaces of bonded conductive silicon electrodes. A thin layer of dielectric material such as silicon oxide or silicon nitride 122 is deposited and patterned on the metal 120 and 121. A thin metal film 123 is then deposited and patterned on the dielectric material 122 to provide an electrical ground surface to shield the electrical charges from dielectric material 122, and also the electrical interferences from the wires 120 and 121. Extra interconnection metal layers and dielectric material layers can be added as described to increase the capacity of the electrical interconnections.

Figure 14:
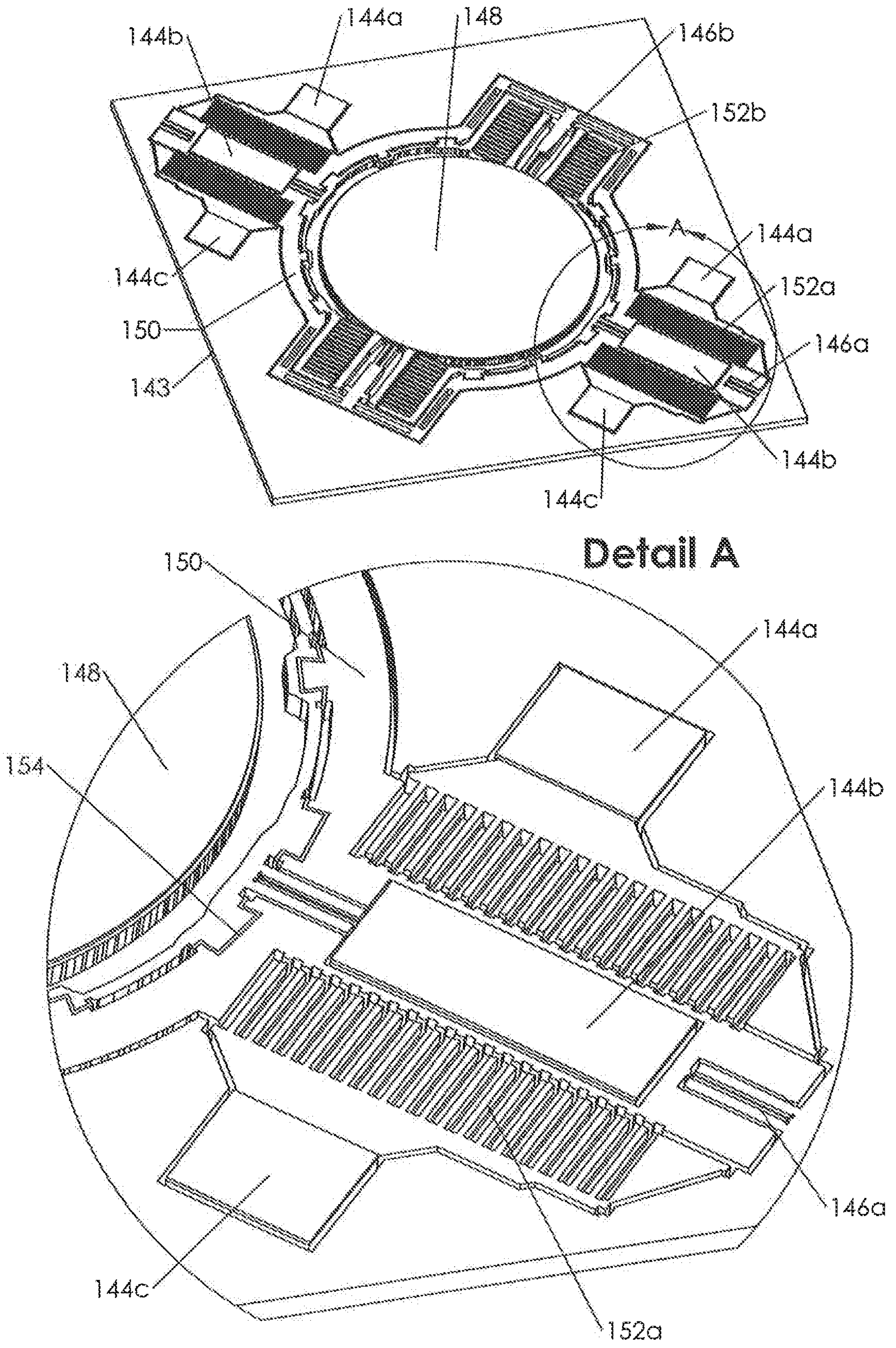
FIG. 14 is a perspective view of a micromirror, vertical comb drive actuator design.
Figure 15:
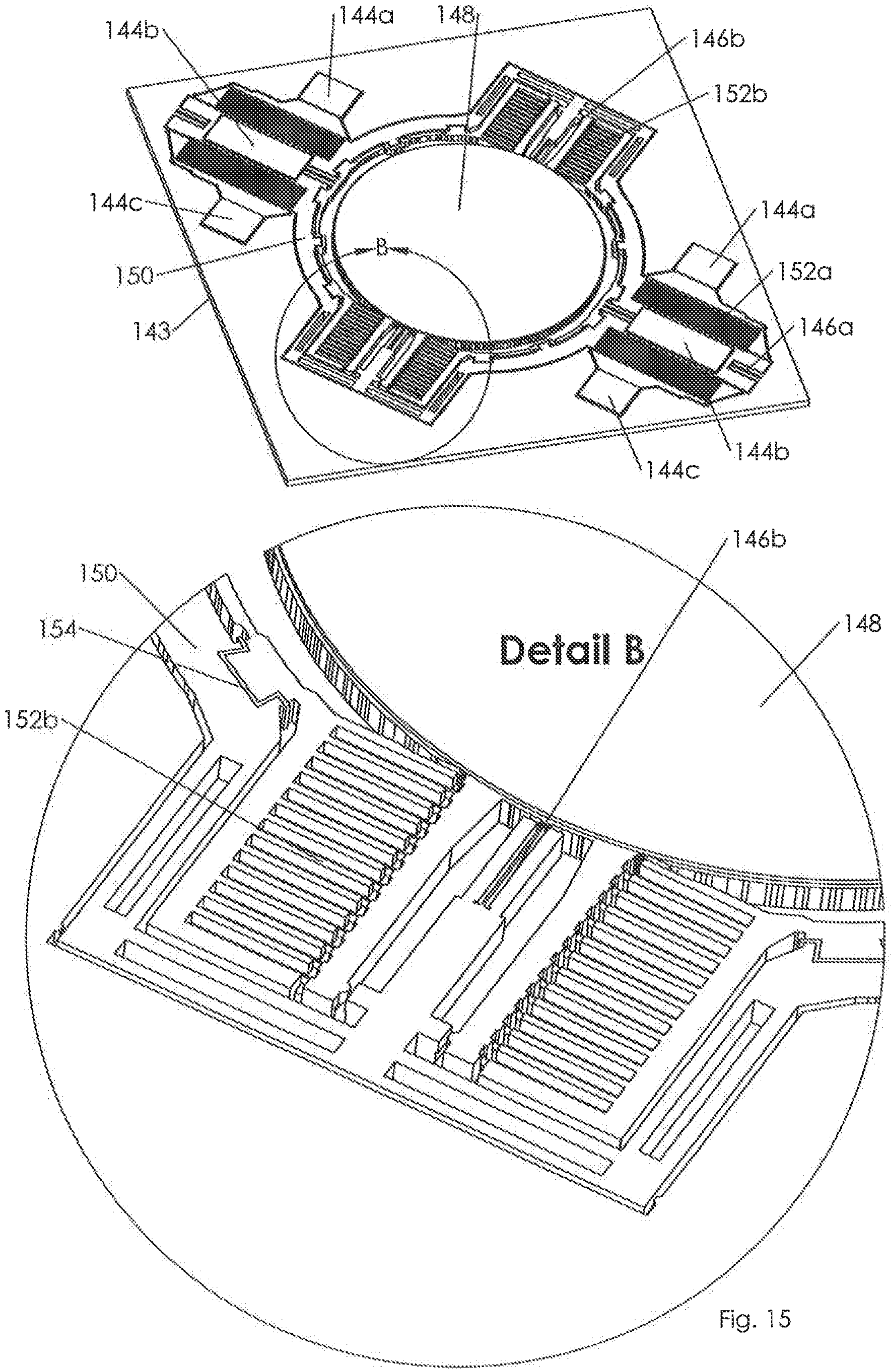
FIG. 15 is a perspective view of a micromirror, vertical comb drive actuator design.
Figure 16A:
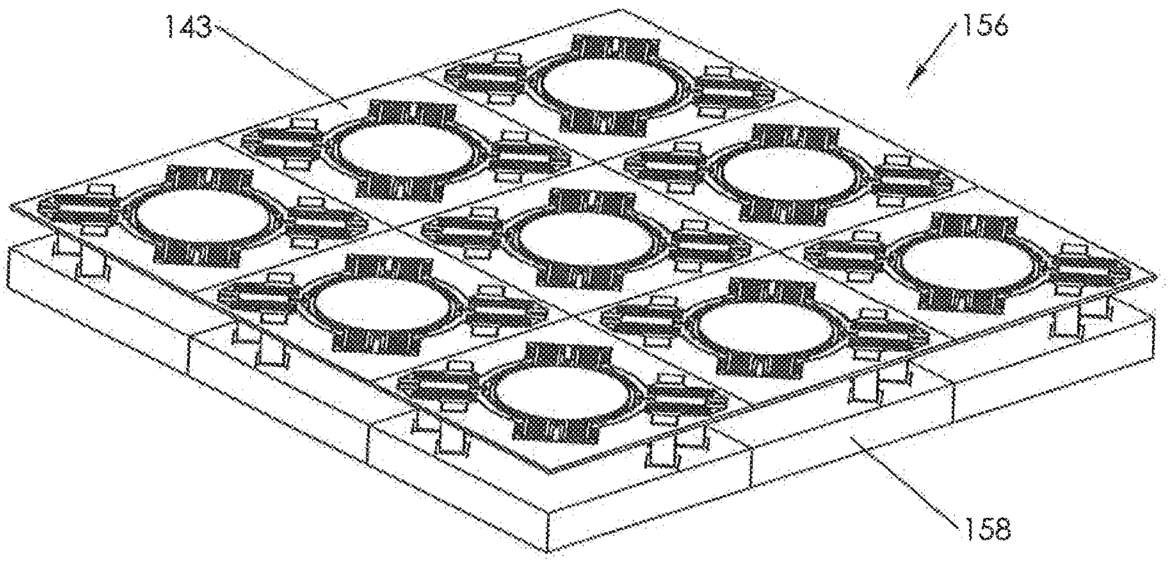
FIGS. 16*a* and 16*b* are perspective views of micromirror array design using the TSV type of carrier wafer.
Figure 16B:
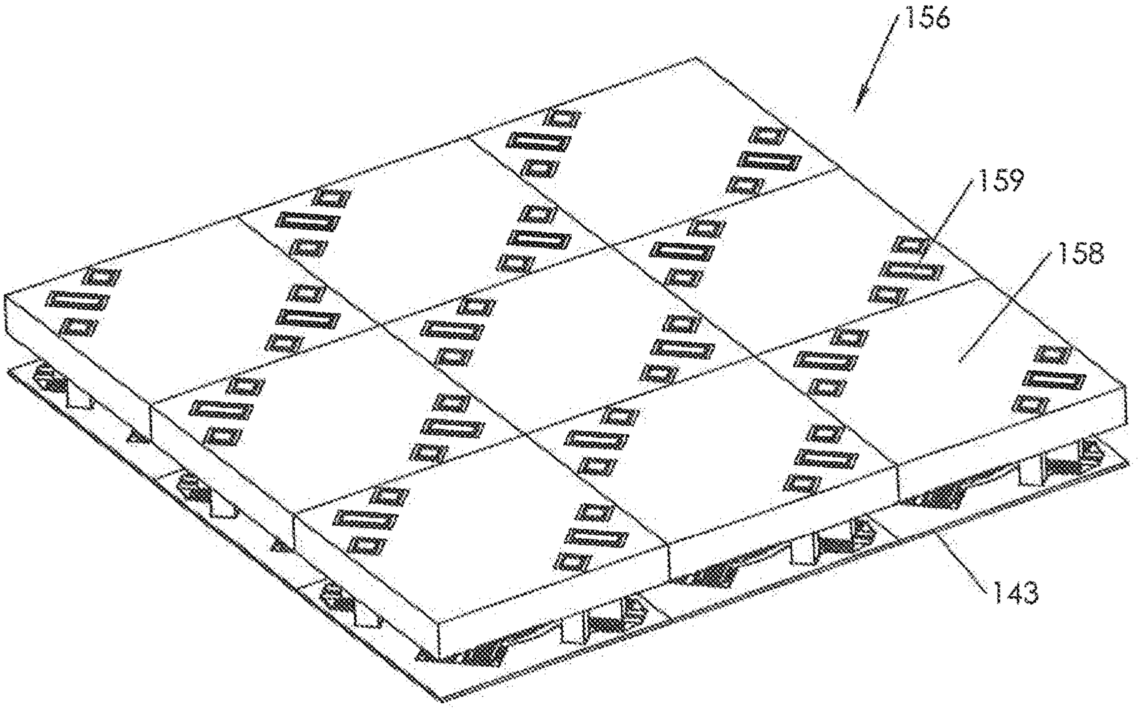

FIG. 14 through 18 are included to show examples of embodiments using some of the options described above. FIGS. 14 and 15 show a detailed design of a micromirror 143 with detailed view of its electrodes 144*a*, 144*b* and 144*c*, hinges 146*a* and 146*b*, mirror 148, mirror frame 150, comb drives 152*a* and 152*b*, trenching and refilling areas 154 etc. Trenching and refilling areas 154 may also be referred to as "isolation trenches". As can be seen, the hinges 146*b* connect the mirror 148 to the mirror frame 150 that circumscribes the mirror 148, and the hinges 146*b* permit rotation of the mirror 148 relative to the frame 150. In this example, the comb drive 152*b* that rotates the mirror 148 about the hinges 146*b* is positioned within the frame 150, and the comb drive 152*a* that rotates the mirror 148 about the hinges 146*a* is positioned outside the frame 150. FIGS. 16*a* and 16*b* show a micromirror array 156 using the partial wafer thickness TSV type carrier wafer 158. In this example, the electrical connections 159 will be channeled out to the external control system from the metal bonding pads on the backside of the chip. It can be easily seen that the mirror array can be easily scaled up without any limitation issue of electrical interconnections.

Figure 17:
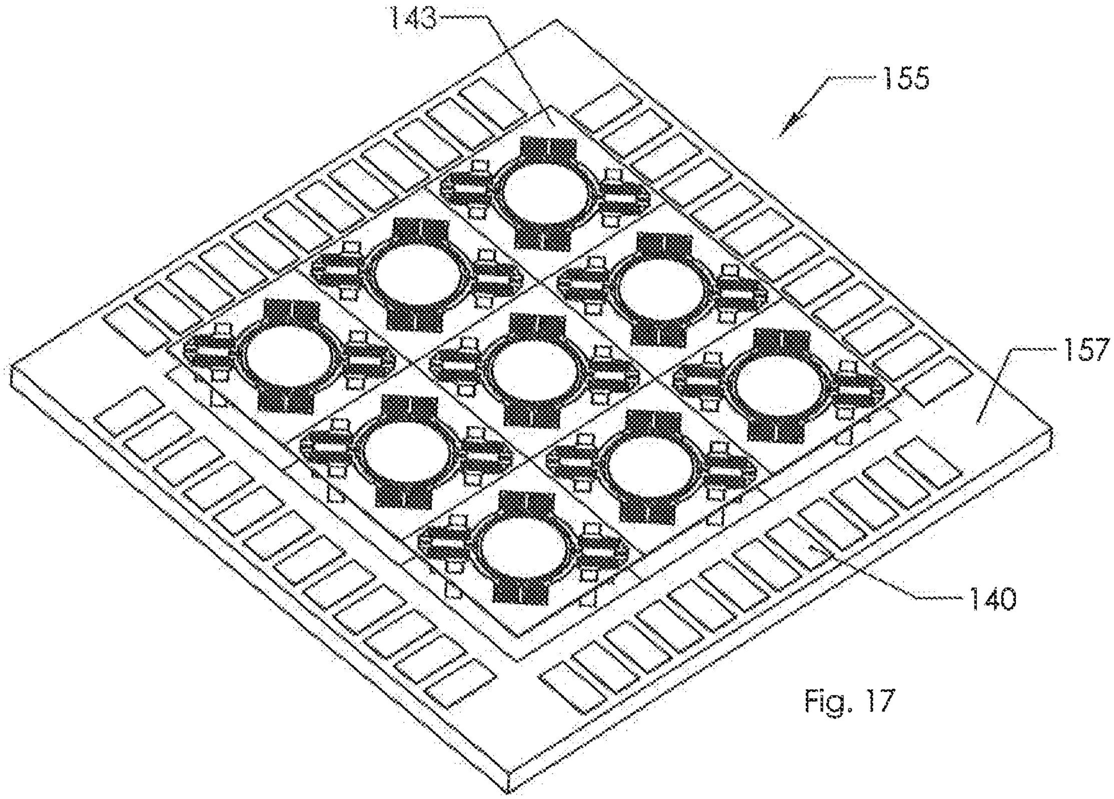
FIG. 17 is a perspective view of micromirror array design using glass wafer.
Figure 18:
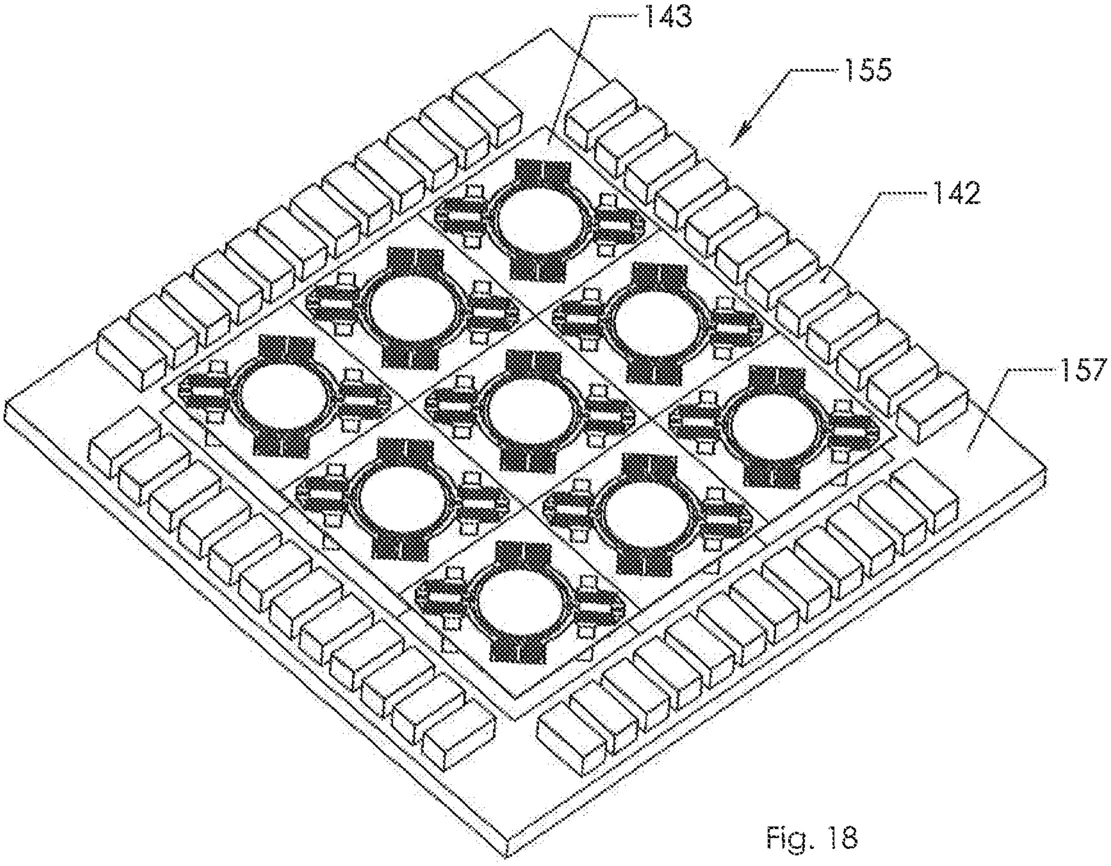
FIG. 18 is a perspective view of micromirror array design using micromirror, vertical comb drive actuators with electrical and mechanical posts, and the flat carrier wafer.

FIGS. 17 and 18 show a micromirror array 155 using a glass carrier wafer 157. In this example, the electrical connections will be routed out to the bonding pad 140 around the chip edge in FIG. 17.

FIG. 18 shows a micromirror array 155 using a micromirror, vertical comb drive actuators with silicon electrical and mechanical posts. The electrical connections will be routed out to the bonding pad 142 around the chip edge.

Besides a self-alignment silicon etching microfabrication process, a relatively simple lithography alignment process technique may be used to make the vertical comb drive actuators and other mirror structures from two layers of electrical conductive single crystal silicon. The process may be used in many various MEMS structures that involve interaction between multiple layers. The basic steps of this process to make the MEMS structure include etching a first layer with a reference mark and the first portion of the MEMS structure, attaching a second layer to the first layer, the second layer overlying the first layer, etching an opening through the second device layer to reveal the reference mark, and etching the second portion of the MEMS structure in the second layer based on the position of the reference mark.

Figure 19:
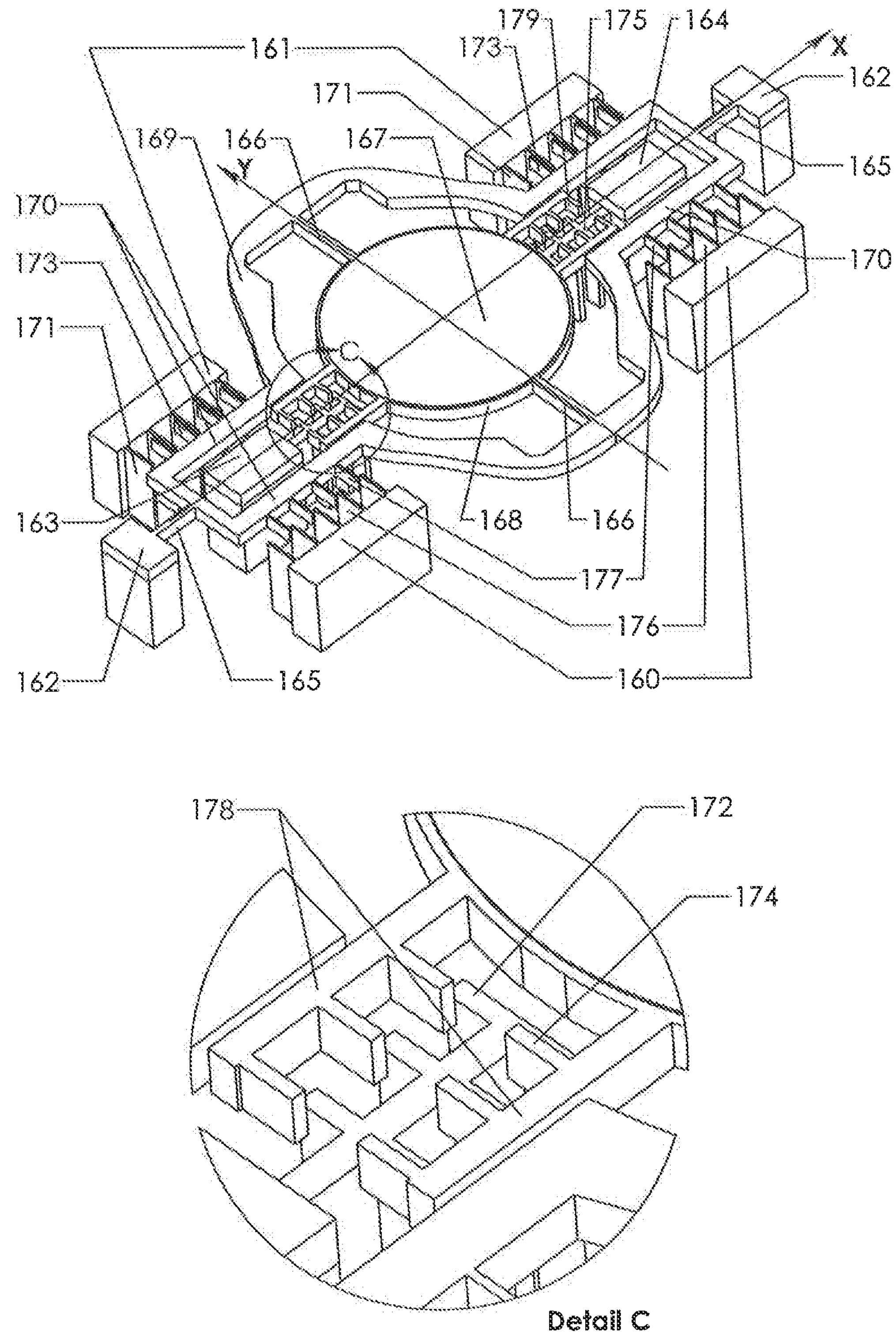
FIG. 19 is a perspective view of micromirror design.

FIG. 19 shows a mirror structure and vertical comb drive actuators fabricated by the lithography alignment process. In this example, the fixed comb fingers set 171, 172, 175 and 176, electrode 160 and 161 are fabricated from the lower layer of electrical conductive single crystal silicon, while mirror 168, gimbal structure 169, flexible hinges 165 and 166, moveable comb finger supporting arms 170 and 178, moveable comb fingers 173, 174, 177 and 179, electrode 162, 163 and 164 are made from the upper layer of electrical conductive single crystal silicon. An optical reflective thin film 167 such as Au thin film may be deposited and patterned on the top surface of the silicon mirror 168.

If an electrical ground is connected to the electrode 162, the mirror 168, gimbal structure 169, flexible hinges 165 and 166, moveable comb finger supporting arms 170 and 178, moveable comb fingers 173, 174, 177 and 179 will be at the zero electrical potential. When an electrical potential/voltage is applied on the electrode 160, then the electrostatic force will be established between the moveable comb finger 177 and fixed comb finger 176, this electrostatic force will actuate the mirror 168, gimbal structure 169, flexible hinge 166, moveable comb finger supporting arms 170 and 178, moveable comb fingers 174 and 179 to rotate clockwise about the X axis, defined by hinges 165; When an electrical potential/voltage is applied on the electrode 161, then the electrostatic force will be established between the moveable comb finger 173 and fixed comb finger 171, this electrostatic force will actuate the mirror 168, gimbal structure 169, flexible hinge 166, moveable comb finger supporting arms 170 and 178, and moveable comb fingers 174 and 179 to rotate counterclockwise about the X axis, defined by hinges 165. When an electrical potential/voltage is applied on the electrode 164, then the electrostatic force will be established between the moveable comb finger 179 and fixed comb finger 175, this electrostatic force will actuate the mirror 168, moveable comb finger supporting arms 178, and moveable comb fingers 174 to rotate clockwise about the Y axis, defined by hinges 166. When an electrical potential/voltage is applied on the electrode area 163, then the electrostatic force will be established between the moveable comb finger 174 and fixed comb finger 172, this electrostatic force will actuate the mirror 168, moveable comb finger supporting arms 178, and moveable comb fingers 179 to rotate counterclockwise about the Y axis, defined by hinges 166.

Figures 23A, 23B, 23C, 23D, 23E, 23F, 23G, 23H:
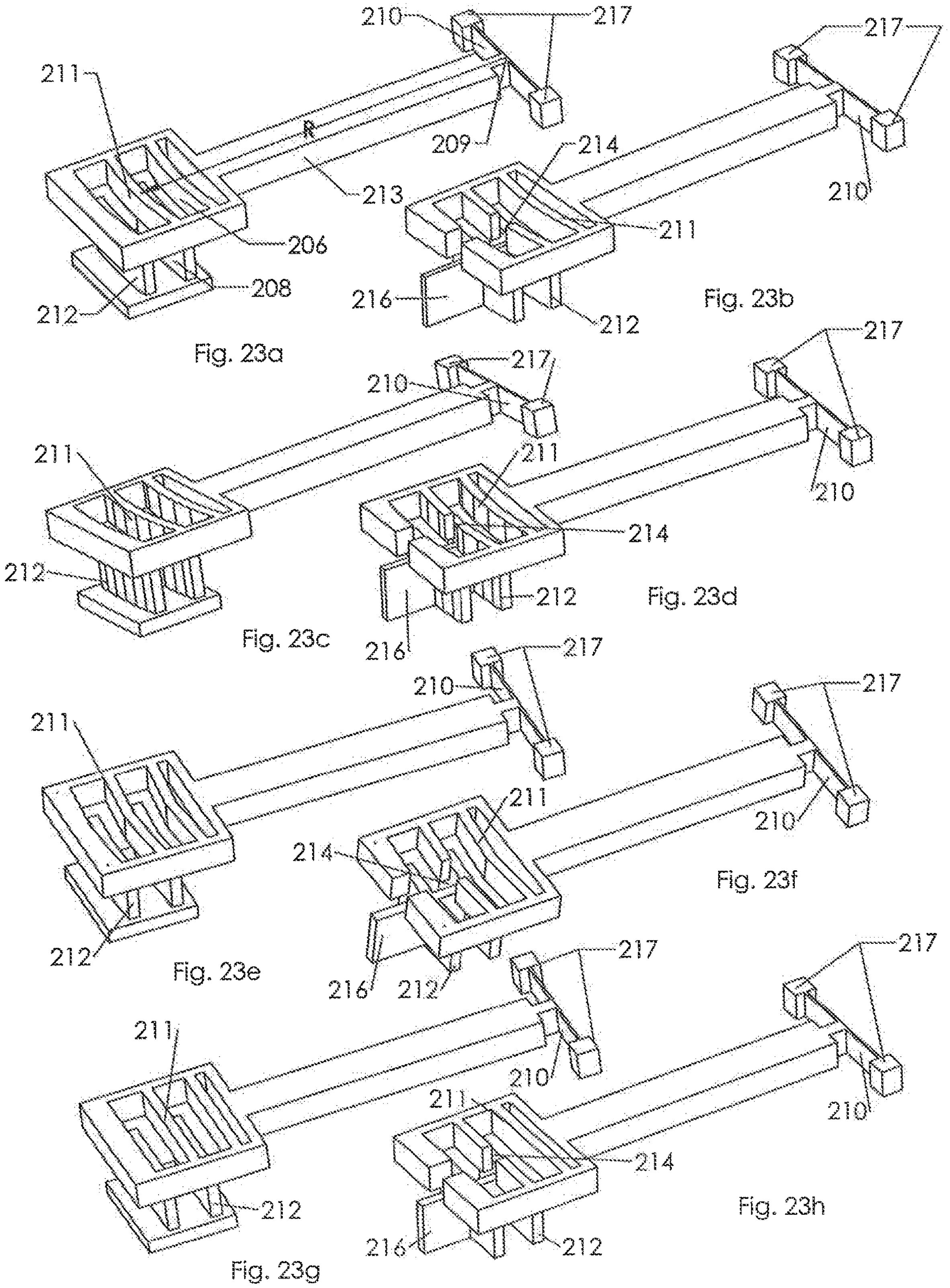
FIG. 23*a* through 23*h* are perspective views of vertical comb drive actuators.

For Y axis tilting, the structural designs for the hinge shape design and vertical comb drive actuators play an important role. The hinge designs may be selected from the hinge shapes shown in FIG. 6, or others known to those skilled in the art. In some embodiments, the orientation of the movable and fixed comb drive fingers of vertical comb drive actuators for Y axis tilting is preferably parallel to the Y axis as shown in FIG. 19 and FIG. 23*g* and FIG. 23*h*, or other shapes shown in FIG. 23*a*-23*f*. The shapes of movable and fixed comb drive fingers may be one straight beam shape, arc shape, or multiple straight beam segments shapes. In other words, the comb drive fingers are preferably designed such that both the fixed and movable fingers extend in a direction having a component that is parallel to the axis of rotation. Preferably, the fingers also have another component that is perpendicular to the axis of oration, which allows the fingers to follow or estimate the radius of curvature as it extends outward from the hinge. For example, if the axis of rotation extends in the X direction, the fingers will extend in a direction that includes an X component, and may be entirely parallel to the axis of rotation. Preferably, the fingers will also have a Y component, which matches or approximates the radius of curvature as defined by the distance of the fingers from the hinge, either by segments or by a curved finger. To promote stable operation of the micromirror, it is important to maintain the moveable and fixed comb finger orientation to be either parallel to, or at a very small angle, for example, less than 3 degrees relative to the rotation about the Y axis, as defined by hinges 210.

As the fingers will move closer together as the fingers rotate out of their stationary plane, the movable fingers are preferably offset relative to the fixed fingers to account for this to avoid any contact between the fingers. Generally speaking, this will require the movable fingers to be moved back from the fixed fingers relative to the axis. In other words, considering a single movable finger positioned between two fixed fingers, where the first fixed finger is closer to the hinge, the movable finger will be closer to the second fixed finger.

As can be seen, each design in FIG. 23*a* through 23*h* has the movable fingers 211 positioned within a frame, while the fixed fingers 212 are similar to posts extending upward from the substrate. This is done to increase the stability of the movable fingers 211. Other designs may also be used, such as movable fingers that extend outward from a central beam to engage fixed fingers.

The major process steps in the lithography alignment process described herein are illustrated in FIG. 20*a*-20*g*, with respect to an example of the fabrication of a vertical comb drive actuator. It will be understood that this example only shows the general steps used to make vertical comb drives and mirror structures, and that process variations may be used in other MEMS structures that require more than one layer, such as a microphone structure, gyroscope sensor structure, accelerometer sensor structure, etc. While FIG. 20*a*-20*g* shows an example of how the process may be used to fabricate a vertical comb drive actuator, similar steps can be used to make the mirror structure, hinges structure, other actuators, etc. Some extra process steps may also be added to make other mirror structures such as the reflective thin film metal on the mirror surface, as will be recognized by those skilled in the art.

Referring now to FIG. 20*a*, a regular SOI (Silicon On Insulator) wafer is shown with device layer 180, dielectric, such as BOX (Buried Oxide), layer 181 and a handle layer 182, such as a silicon handle layer. Referring to FIG. 20*b*, a DRIE process is then used to etch the device layer 180. The lower comb drive finger 184 is fabricated along with the alignment reference mark 183. An oxide RIE process is used in FIG. 20*c* to etch away the oxide 185 between the lower comb drive fingers formed in FIG. 20*b*. The wafer bonding is shown in FIG. 20*d* between etched SOI wafer and another SOI wafer with device layer 189, BOX layer 188 and handle wafer 187. All the silicon layers of both SOI wafers are electrical conductive. Referring to FIG. 20*e*, after removing the handle layer 187 and BOX layer 188 using typical silicon etching and oxide etching processes, a silicon etching process such as DRIE is used to open a window 190 on the device layer 189 as shown in FIG. 20*f*, and lithography alignment tools such as contact lithography mask aligner and/or stepper lithography mask aligner are able to align the upper comb drive fingers 191 to the lower comb drive finger 184 with the help of the reference mark 183. Referring to FIG. 20*g*, after this critical lithography process step, a silicon DRIE is used to fabricate the upper comb drive finger 191. FIG. 20*a*-20*g*

Figure 21A:
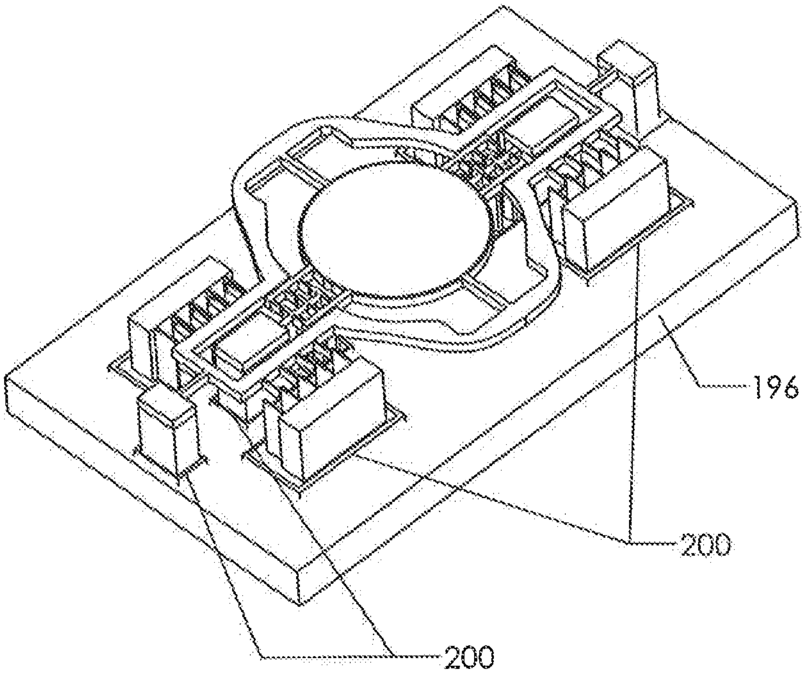
FIGS. 21*a* and 21*b* are perspective views of a micromirror and mirror array design.

A single two dimensional tilting mirror, such as the example shown in FIG. 19, can be fabricated using the process shown in FIG. 20*a*-20*g*. If the full or partial wafer thickness TSV silicon wafer is used during the device fabrication, then the mirror shown in FIG. 21*a* may be made with vertical electrical interconnections and can be used to form a very large mirror array with high fill factor.

Figure 21B:
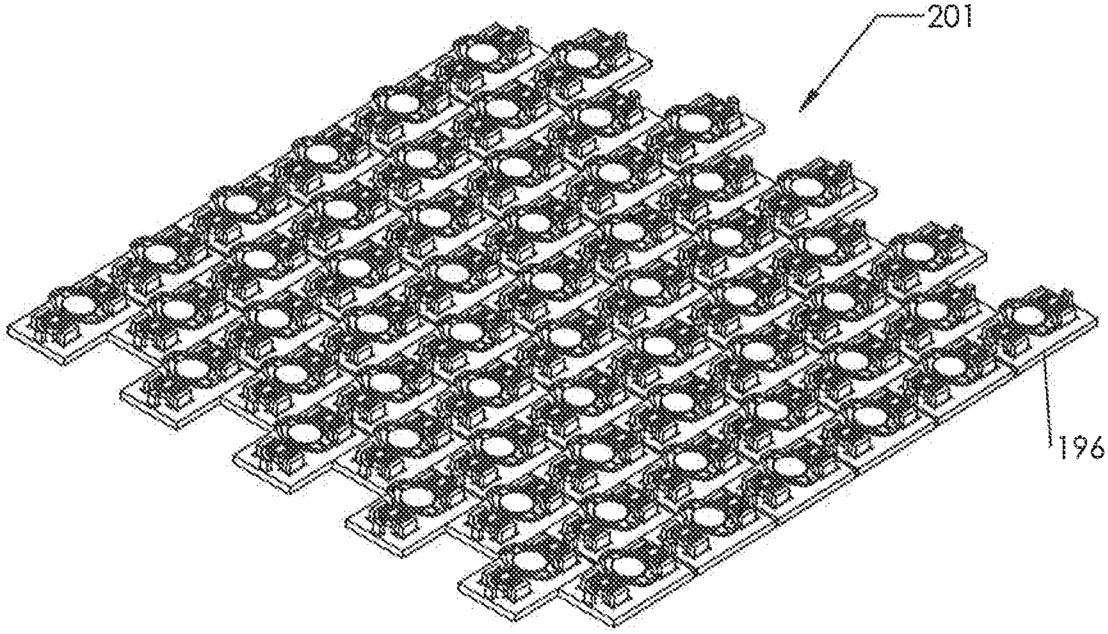

In FIG. 20*a*, a partial wafer thickness TSV silicon wafer 196 is used to replace the regular SOI wafer with device layer 180, BOX layer 181 and handle silicon layer 182. The DRIE will be used to etch the silicon to reach the top of the trenching and refilled rings. The electrical insulation trenching and refilled rings 200 are exposed and shown in FIG. 21*a*. FIG. 21*b* shows the part of very larger mirror array 201 with high fill factor.

Figure 22A:
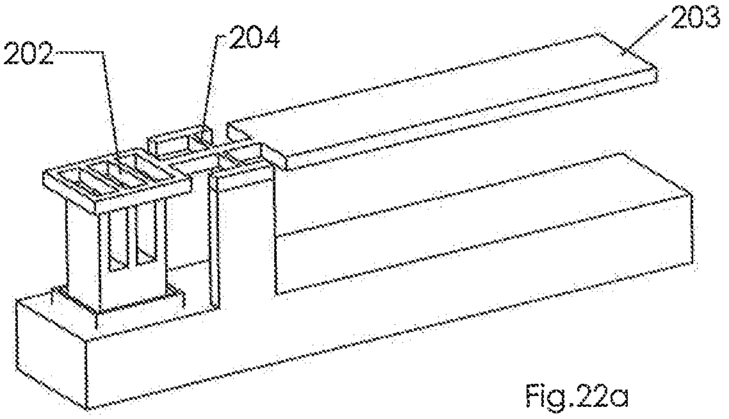
FIG. 22*a* through 22*c* are perspective views of a micromirror and mirror array design.
Figure 22B:
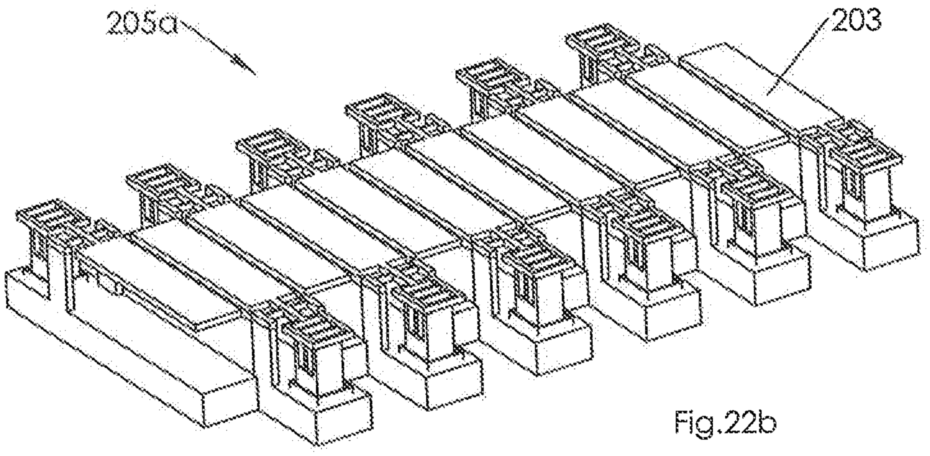
Figure 22C:
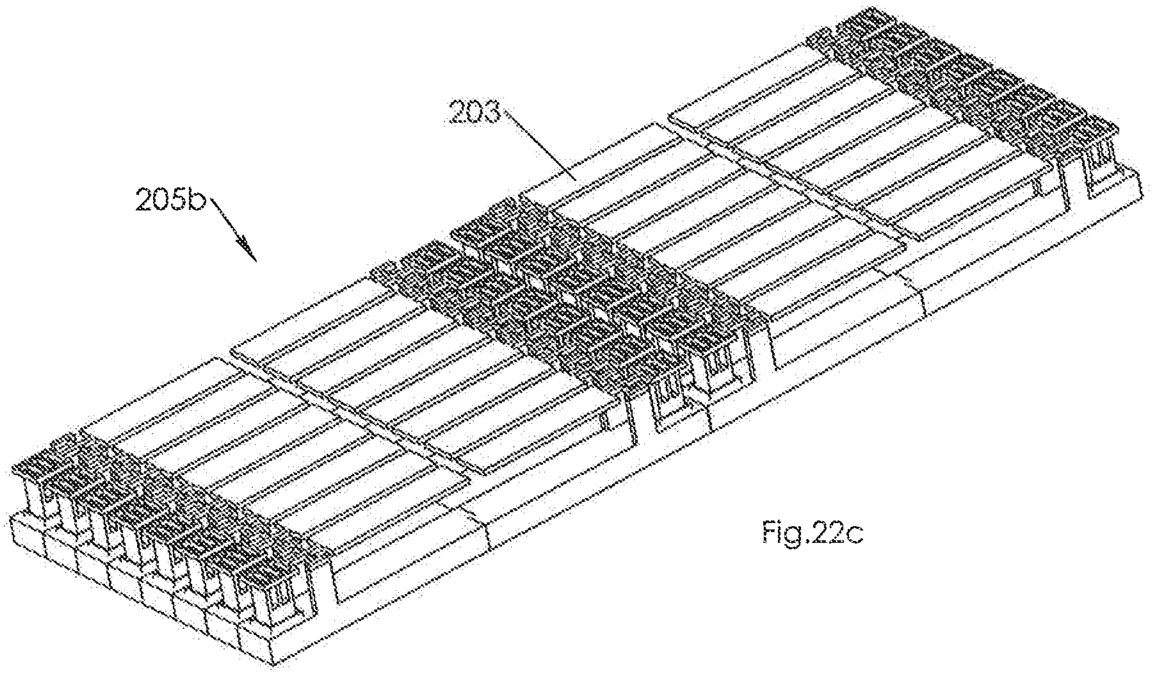

FIG. 22*a* shows a one dimensional tiling mirror 203 fabricated using the partial wafer thickness TSV silicon wafer and the simple lithography alignment process. The vertical comb drive actuator 202 will tilt the mirror 203 about the hinge 204. The varieties of high fill factor micromirror array 205 can be formed using the mirror 203 shown in FIG. 22*a*. A one dimensional mirror array 205*a* with high fill factor is shown in FIG. 22*b*. A two dimensional mirror array 205*b* with high fill factor is shown in FIG. 22*c*.

The orientations and shapes of the vertical combdive fingers are directly related to the performance of the vertical comb drive actuator. The FIG. 23*a*-23*h* shows some examples vertical comb drive actuators. FIG. 23*a* shows a fixed comb drive fingers 208, 212 and moveable vertical comb drive fingers 206, 211. When an electrical potential is applied between the moveable and fixed comb drive fingers, the actuator will tilt the structure 213 about the rotation hinge 210. The hinge 210 is anchored by 217. If the axis center point is 209, and R is the distance between the axis center point 209 to the location of the comb drive finger 211, then the ideal shape of moveable comb drive finger 211 is the arc shape with the radius of R from the axis center point 209. The other fingers 206, 208 and 212 will be designed in the same manner. Therefore the radius of finger 206 is smaller that radius of finger 211, also the radius of finger 208 is smaller that radius of finger 212. Due to the rotation of the structure 213, the moveable finger 211 will rotate close to fixed comb finger 208, while it will rotate away from the finger 212. For this reason, the initial position of finger 211 is not designed in the middle position between fixed finger

208 and 212. Instead, the finger 211 is designed a bit close to the finger 211 initially to increase the rotation stability and tilting range of the actuators.

FIG. 23*b* shows a design variation of vertical comb drive shown in FIG. 23*a*. The moveable comb drive is cut to have opening 214 to allow movement of the structure 216 without mechanical and electrical interferences between fixed and moveable fingers. The structure 216 is used to connect the fixed comb drive fingers to the mechanical anchor and electrical actuation electrode.

If the purely arc shaped finger is not used and when R is relatively large, a variety of simplified finger shapes may be used. Examples are shown in FIGS. 23*c* and 23*d* where fingers with multiple straight beam segments are designed to resemble the arc shape to the rotational axis point 209. Typically, the straight beam segments have very small angles (such as less than 3 degrees) to the rotational axis. FIGS. 23*e* and 23*f* show fingers with the one straight beam segment to resemble the arc with larger radius R. FIGS. 23*g* and 23*h* show straight beam finger which is parallel to the rotation axis 209, when the radius R is sufficient large.

Figure 24A:
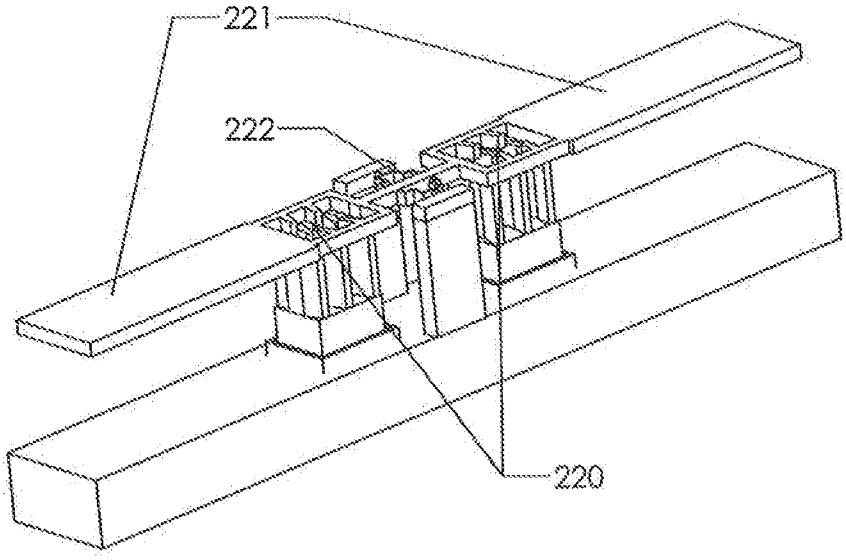
FIGS. 24*a* and 24*b* are perspective views of a micromirror and mirror array design.
Figure 24B:
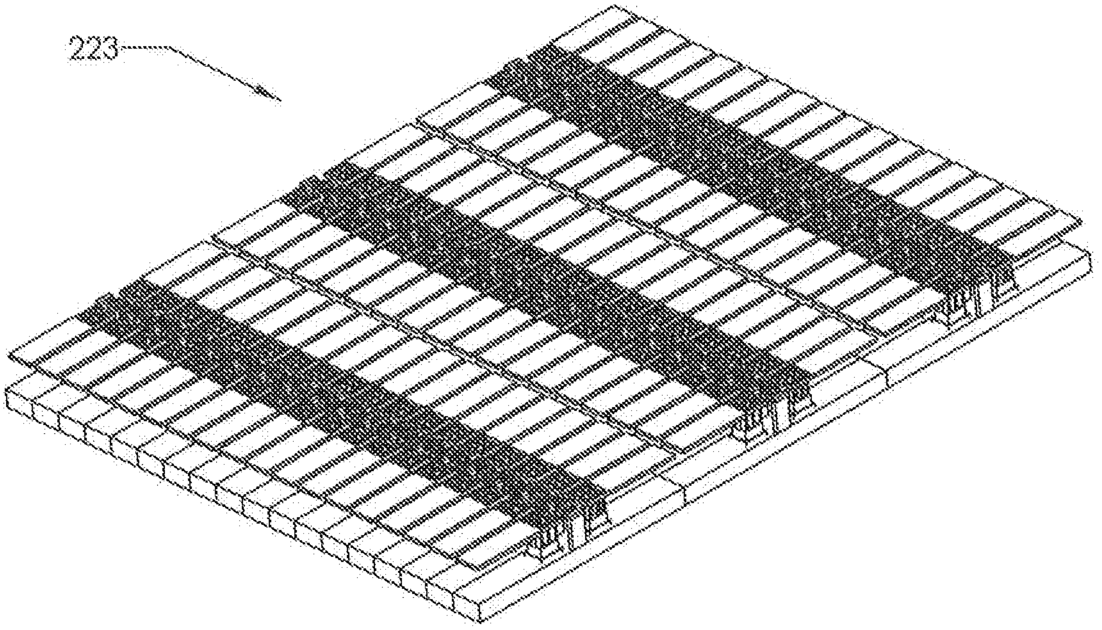

FIG. 24*a* shows a one dimensional tilting mirror fabricated using the partial wafer thickness TSV silicon wafer and the lithography alignment process described previously. The vertical comb drive actuators 220 tilt the mirror about the hinges 222 clockwise and counterclockwise. A variety of high fill factor micromirror array may be formed using the mirrors structure shown in FIG. 24*a*. A two dimensional mirror array 223 formed with high fill factor is shown in FIG. 24*b*.

Figure 25A:
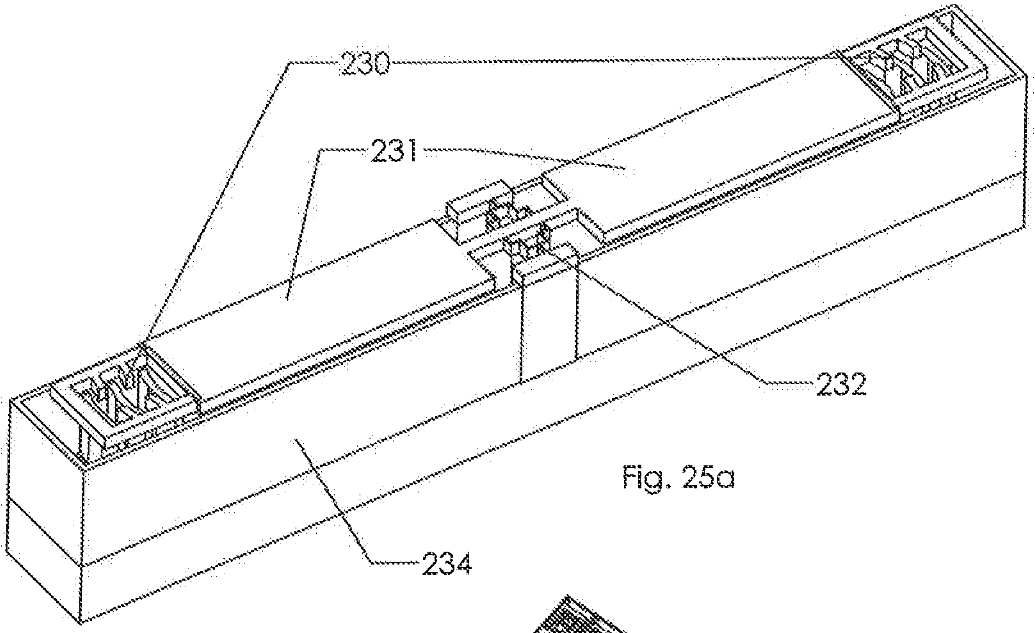
FIGS. 25*a* and 25*b* are perspective views of a micromirror and mirror array design.
Figure 25B:
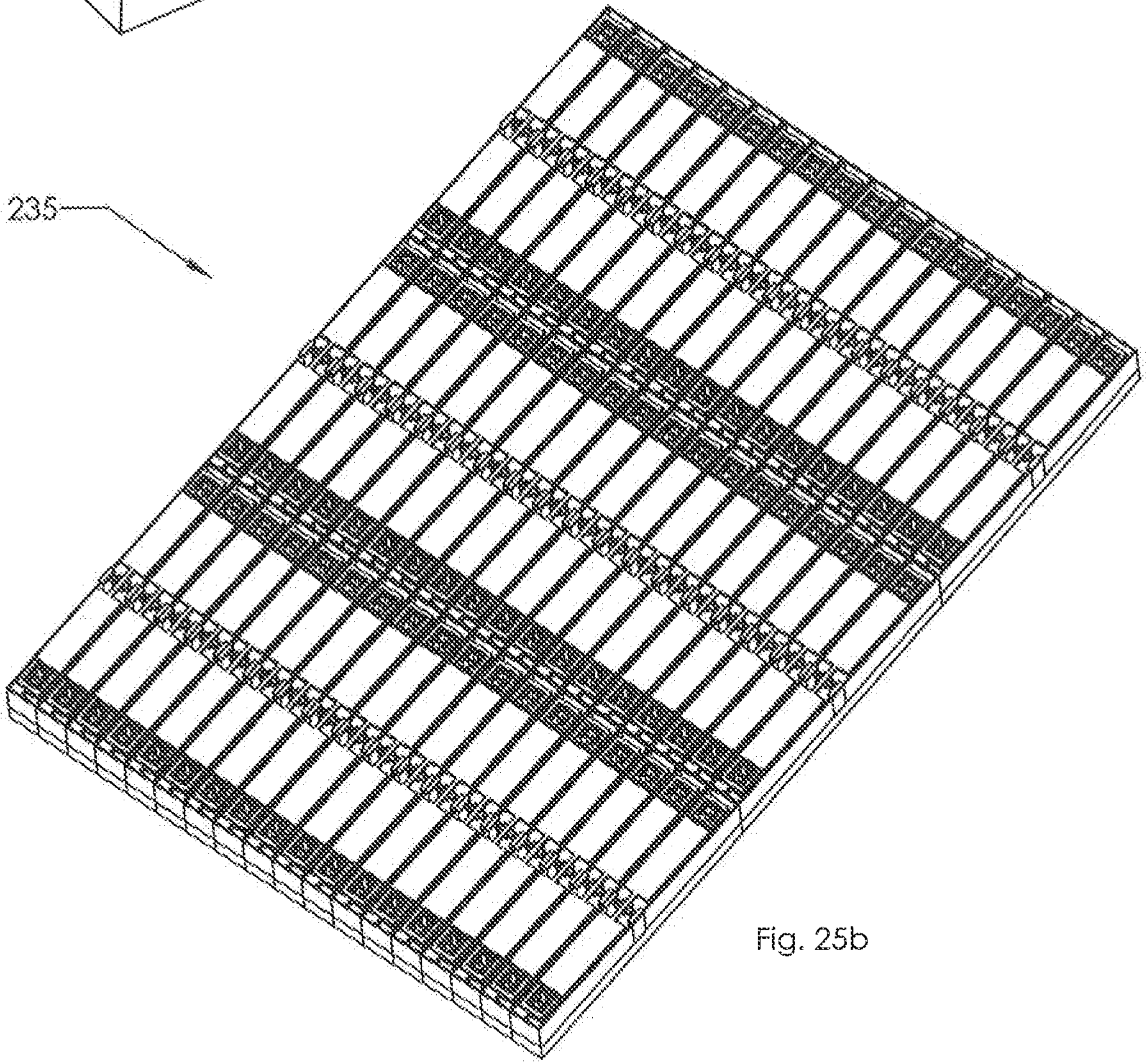

FIG. 25*a* shows a one dimensional tilting mirror fabricated using the partial wafer thickness TSV silicon wafer and the lithography alignment process described previously. The vertical comb drive actuators 230 tilt the mirrors 231 about the hinges 232 clockwise and counterclockwise. The varieties of high fill factor micromirror array can be formed using the mirror structure shown in FIG. 25*a*. Preferably, a thin silicon wall 234 surrounds the mirror structure and vertical comb drive actuators. If this wall is connected to the electrical ground, then it will provide two functions. One is to provide an electrical shield to avoid the electrical interference between actuators of adjacent mirrors in the array structure. The other is to provide a mechanical barrier for the squeezed air flow resulting from the actuation of the mirror. With the thin silicon wall barrier 234, the squeezed air flow resulted from the moving mirror will not affect the adjacent mirror position. A two dimensional mirror array 235 formed with high fill factor is shown in FIG. 25*b*. The thin silicon wall 234 can be removed if required, for example, by limited space between adjacent two mirror structures. If needed, however, the thin silicon wall structure may be implemented in some or all of the mirrors and mirror array.

Figure 26A:
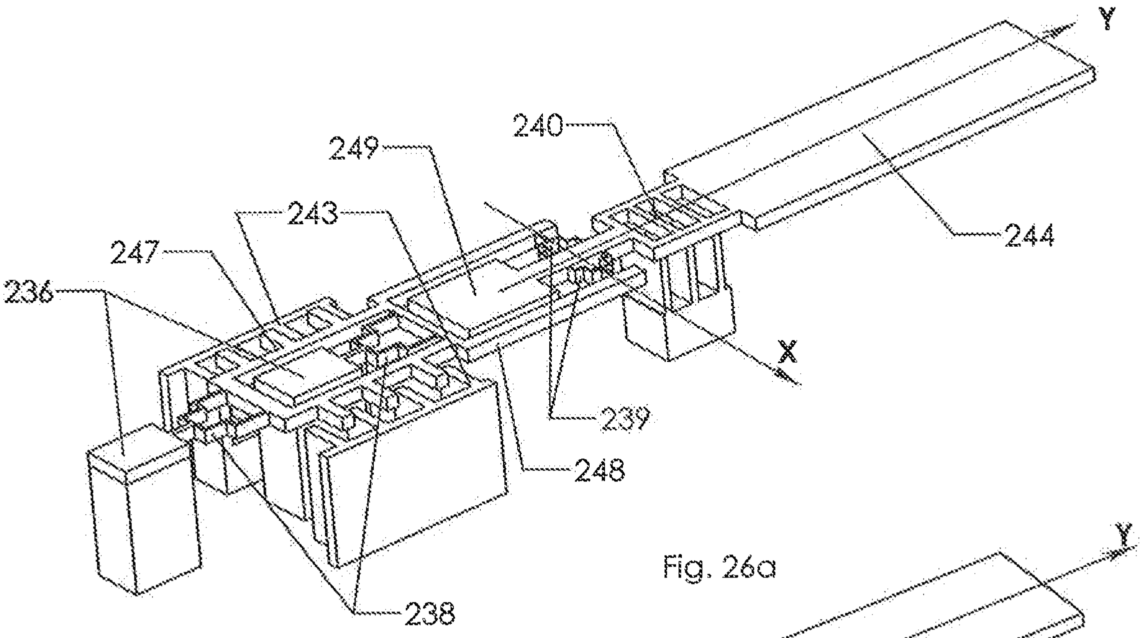
FIG. 26*a* through 26*c* are perspective views of micromirror designs.
Figure 26B:
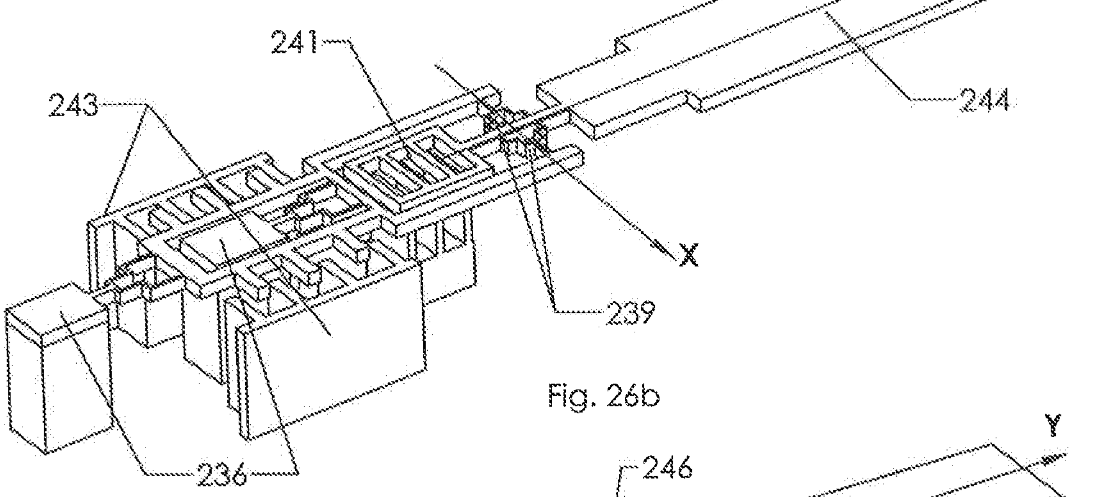
Figure 26C:
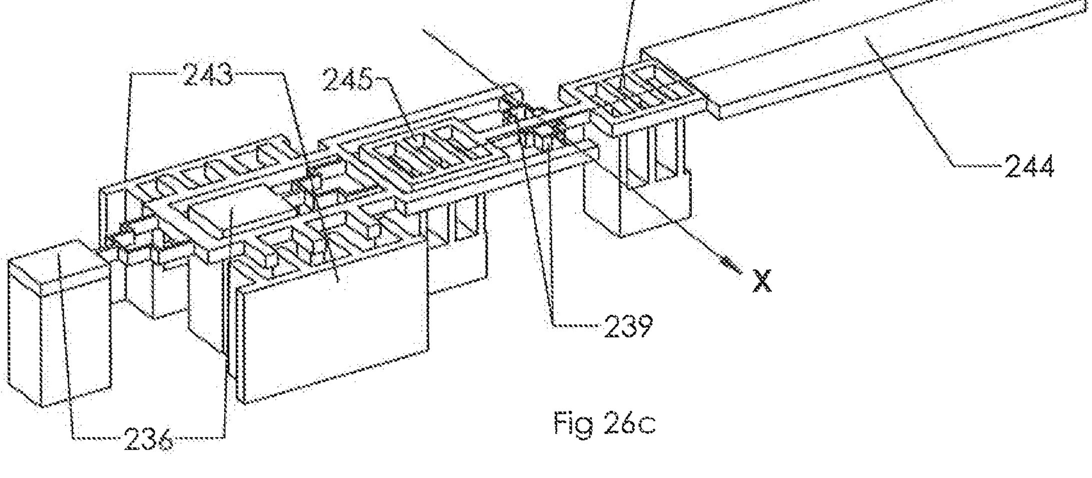

The lithography alignment process described previously may also be used to make the two dimensional tilting mirrors shown in FIG. 26*a*-26*c*. The depicted tilting mirrors include a mirror 244, movable fingers of the vertical comb drive actuator 240 for tilting about the X axis, X-axis hinges 239, weight balance part 249, supporting arm structures 248, movable fingers of the vertical comb drive actuators 243 for tilting about the Y axis, Y-axis hinges 238 and supporting arms 247 for movable fingers suspended/anchored by two electrode structures 236.

If an electrical ground is connected to the electrodes 236, then the mirror 244, movable fingers of the vertical comb drive actuator 240 for tilting about the X axis, X-axis hinges 239, weight balance part 249, supporting arm structures 248, movable fingers of the vertical comb drive actuators 243 for tilting about the Y axis, Y axis hinges 238 and supporting arms 247 for movable fingers are at zero electrical potential. When the fixed fingers of vertical comb drive actuator 243 are connected to an electrical potential, the resulting electrostatic forces from actuators 243 will rotate the mirror 244, movable fingers of the vertical comb drive actuator 240 for tilting about the X axis, X axis hinges 239, weight balance part 249, supporting arm structures 248, movable fingers of the vertical comb drive actuators 243 for tilting about the Y axis, Y axis hinges 238 and supporting arms 247 for movable fingers about the Y axis/hinge 238 clockwise and counterclockwise. When the fixed fingers of vertical comb drive actuator 240 are connected to an electrical potential, the resulting electrostatic forces from actuator 240 will rotate the mirror 244 and weight balance part 249, X axis hinges 239 about the X axis/hinge 239 clockwise.

FIG. 26*b* shows a design variation of the mirror structure shown in FIG. 26*a*. The actuator 241 will rotate the mirror 244 and X axis hinges 239 about the X axis/hinge 239 counterclockwise. FIG. 26*c* shows another design variation of the mirror structure shown in FIG. 26*a*. The actuators 246 and 245 will rotate the mirror 244 and X axis hinges 239 about the X axis/hinge 239 clockwise and counterclockwise.

Figure 27A:
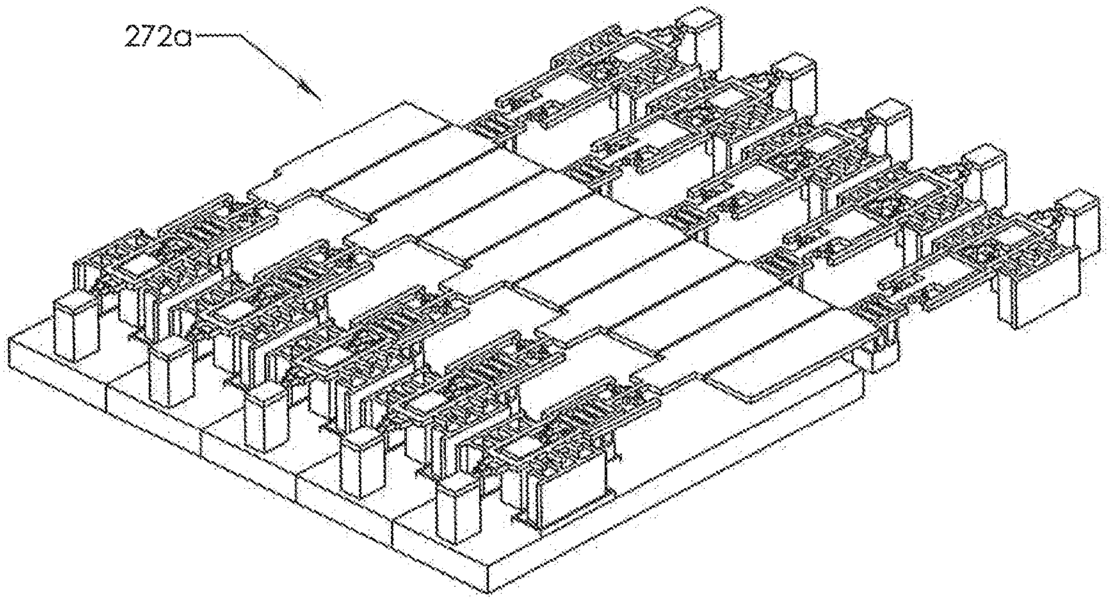
FIGS. 27*a* and 27*b* are perspective views of micromirror array designs.
Figure 27B:
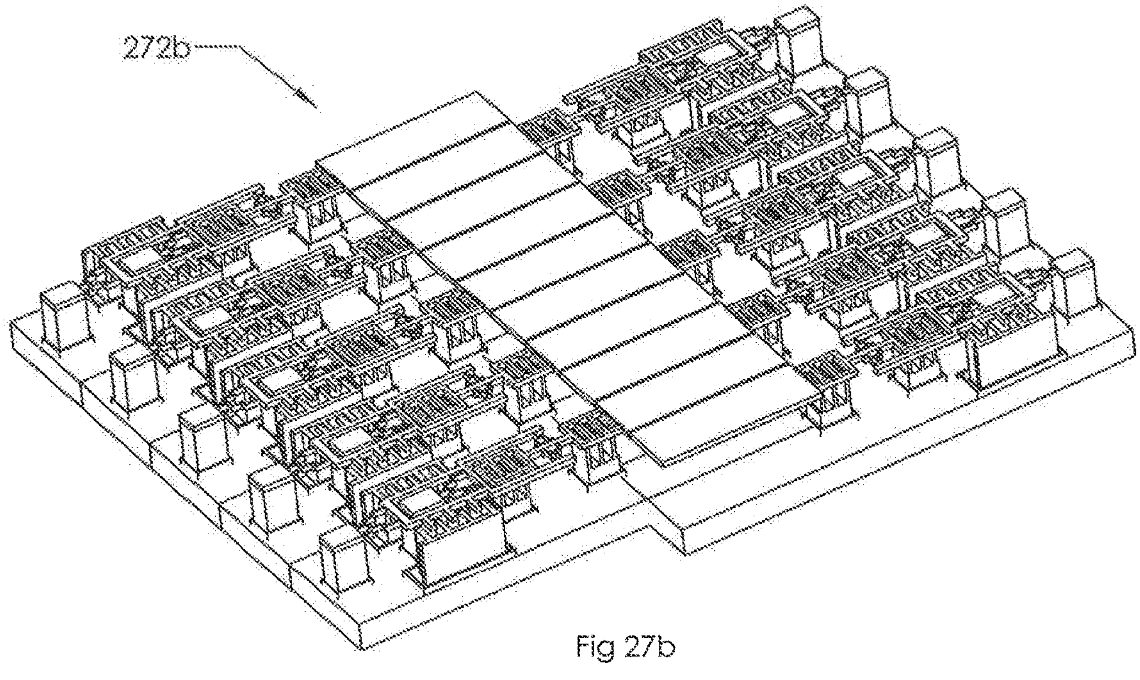
Figure 28A:
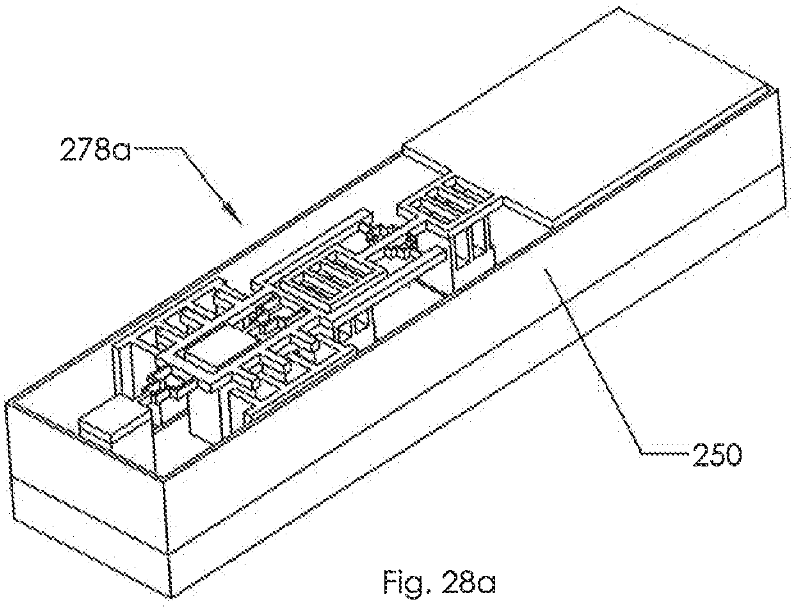
FIGS. 28*a* and 28*b* are perspective views of a micromirror and mirror array design.
Figure 28B:
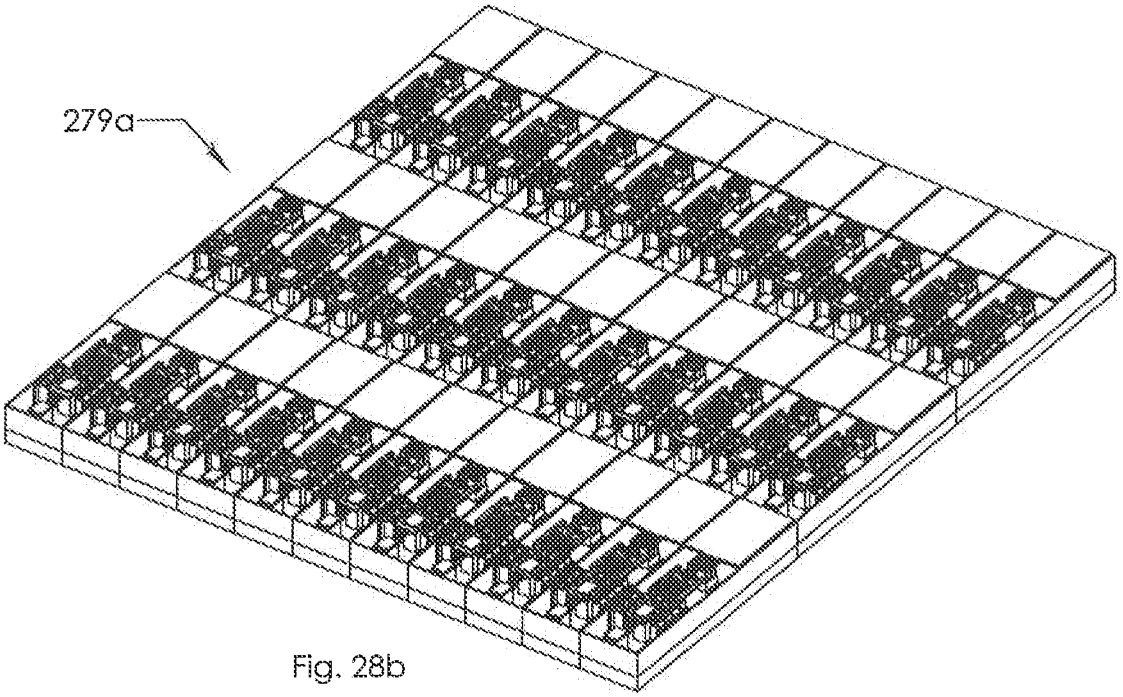

If both partial wafer thickness TSV silicon wafer and the lithography alignment process are used to make the two dimensional tilting mirror shown in FIG. 26*a* through 26*c*, then the mirror array 272*a* shown in FIG. 27*a* can be formed by mirror structure shown in FIGS. 26*a* and 26*b*, and another mirror array 272*b* shown in FIG. 27*b* can be formed by mirror structure shown in FIG. 26*c*. These mirror arrays will have high fill factor. The thin silicon wall can be added to the mirror structures shown in FIGS. 26*a* and 26*c* and mirror array structures shown in FIGS. 27*a* and 27*b*. FIG. 28*a* shows a two dimensional tilting mirror structure 282 with thin silicon wall 250, and FIG. 28*b* shows the mirror array structure 284 formed by the mirror structure 282 shown in FIG. 28*a*.

Referring to FIG. 26*a*, the weight balance part 249 is used to balance the weight of mirror 244 to achieve good mirror stability. In the vibration and shocking environments, the inertial force from the mirror weight will result in undesirable mirror tiling about the X axis/hinges 239. The thicker and higher density metal film can be deposited on the top surface of weight balance part 249 with the larger size and thicker silicon structure in order to have the same inertial force torque to the X axis/hinges 239 as the mirror 244.

Figure 29A:
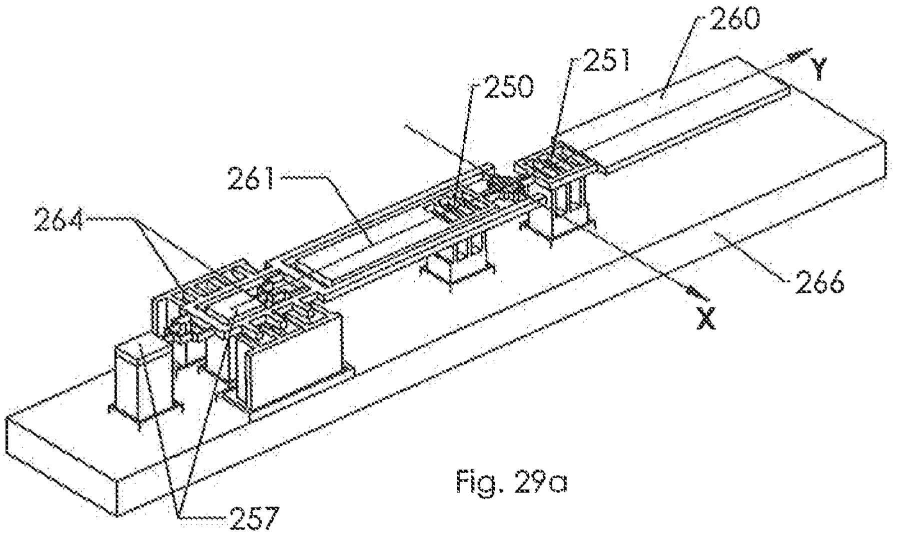
FIG. 29*a* through 29*c* are perspective views of micromirror designs.
Figure 29B:
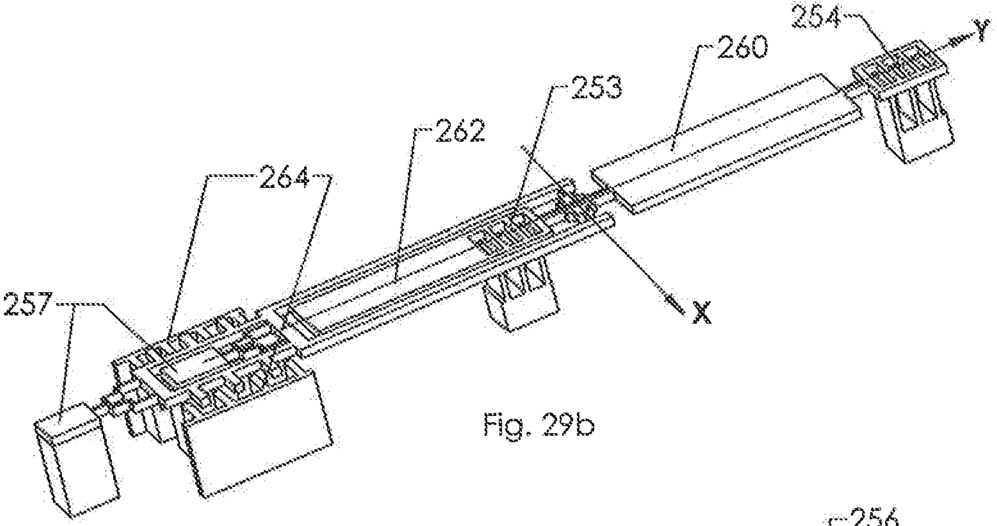
Figure 29C:
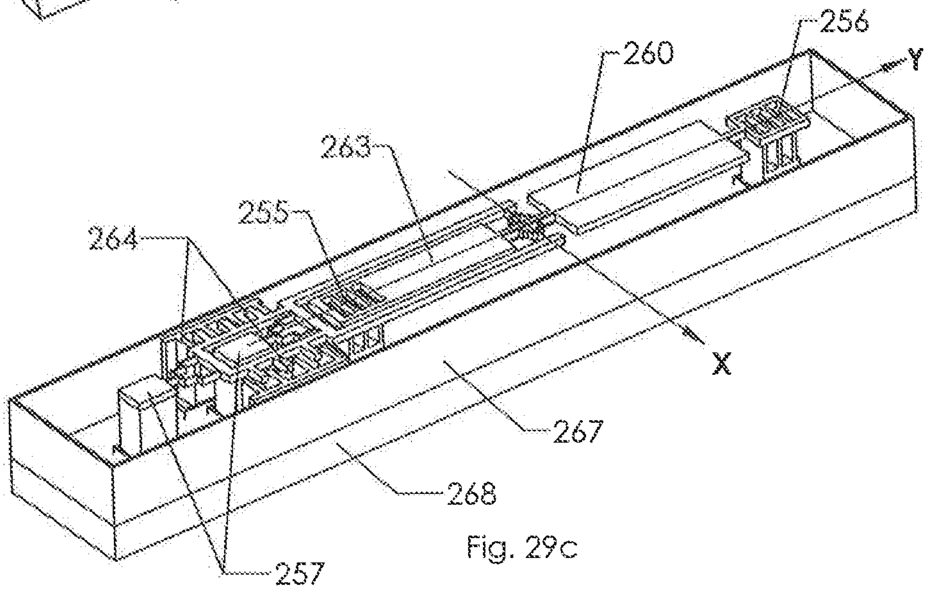

Referring to FIG. 29*a* through 29*c*, weight balance parts 261, 262 and 263 may be used in the mirror structure. In this example, if the electrodes 257 are connected to the electrical ground, under the actuations of the actuators 264, the mirrors 260 will have clockwise and counterclockwise rotation about the Y axis, under the actuations of the actuators 251 and 250, actuators 254 and 253 and actuators 256 and 255, the mirrors 260 will have clockwise and counterclockwise rotation about the X axis. FIG. 29*a* depicts an example of a mirror structure fabricated using partial wafer thickness TSV silicon wafer 266 and the lithography alignment process described above.

The mirror structure shown in FIG. 29*b* may be fabricated using partial wafer thickness TSV silicon wafer and the simple lithography alignment process, or can be fabricated using regular SOI wafer and the simple lithography alignment process. The mirror structure with thin silicon wall 267 shown in FIG. 29*c* is fabricated using partial wafer thickness TSV silicon wafer 268 and the simple lithography alignment process. Depending on the rotation angle requirements, some design modifications can be applied to these mirror structures shown in FIG. 29*a*-29*c*. For example, actuators 251, 253 and 255 may be removed from the mirror structures shown in FIG. 29*a*, FIG. 29*b* and FIG. 29*c* respectively.

The mirror structures shown in FIG. 29*a*-29*b* may be used to form the mirror array structures shown in FIG. 22*b*, FIG. 22*c*, FIG. 24*b*, FIG. 25*b*, FIG. 27*a*, FIG. 27*b* and FIG. 28*b*.

Figure 30A:
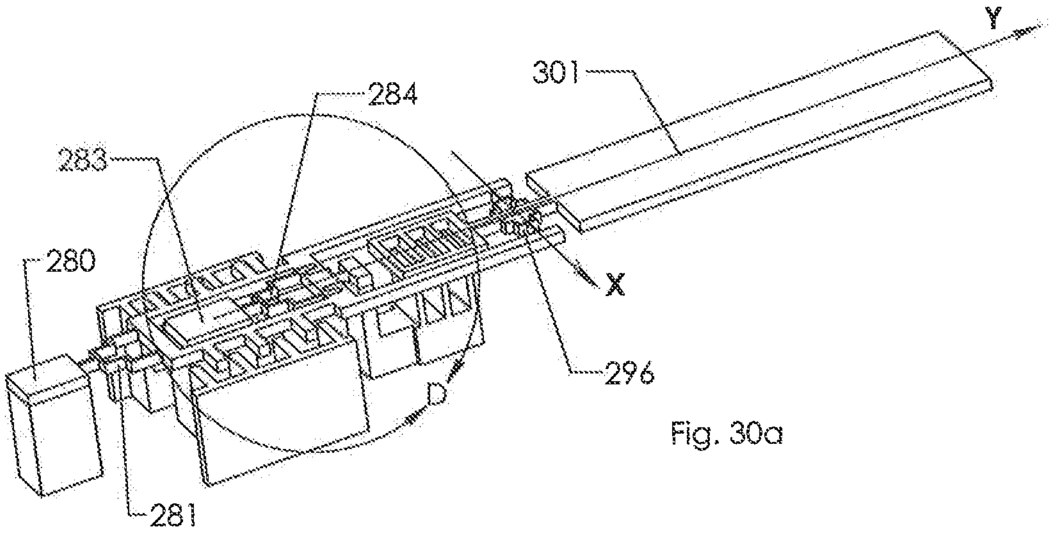
FIGS. 30*a* and 30*b* are perspective views of micromirror designs.
Figure 30B:
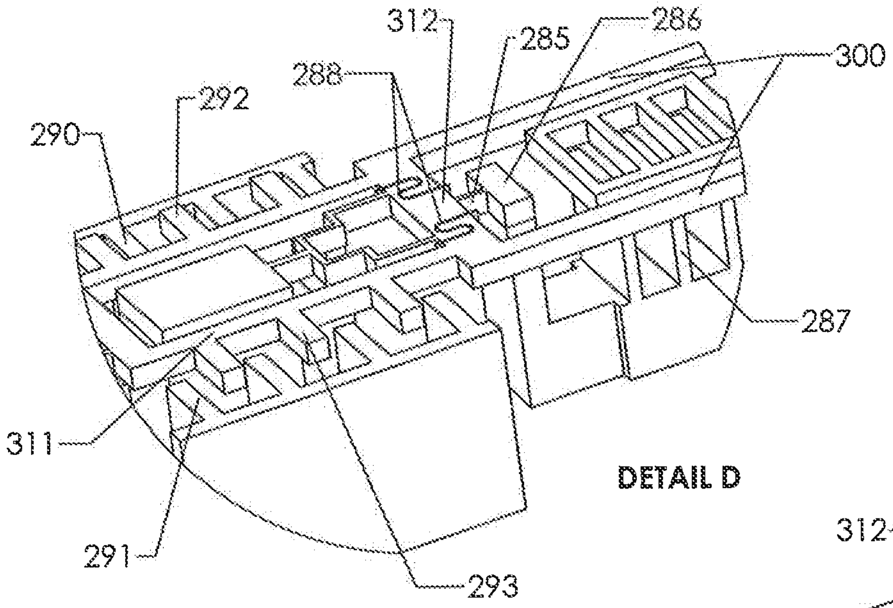
Figure 30B:
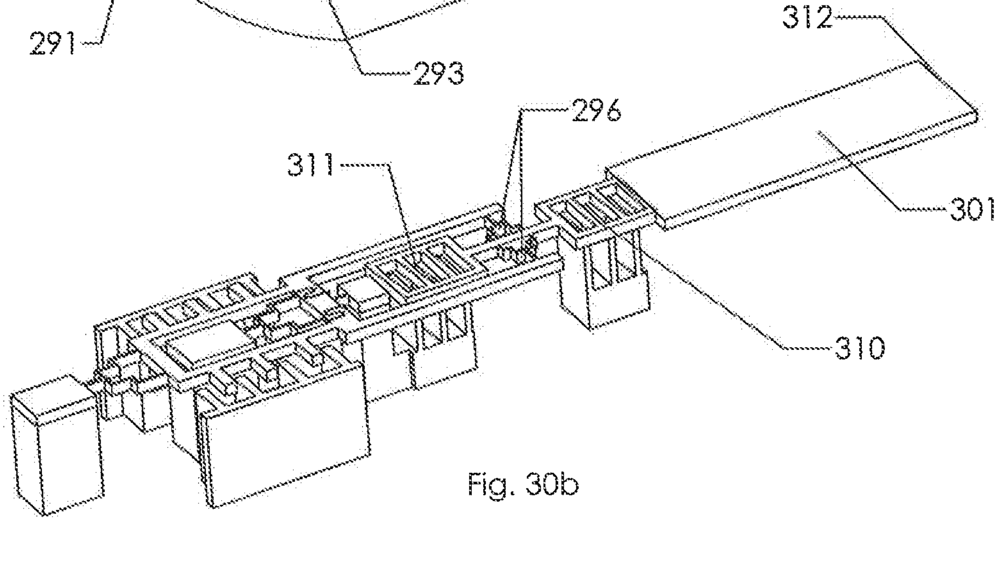

In the process flow shown in FIG. 20*a*-20*g*, if the device layer 189 of the SOI wafer shown in FIG. 20*d* is replaced with a device layer having trenching and refilled with dielectrical material, then more mirror structure variations can be achieved. In FIGS. 30*a* and 30*b*, the trenching and refilled region 288 electrically isolate and mechanically connect the electrode 283, hinge 284 and 285, connection part 312, pad 286, and fixed comb drive fingers 287 with electrode pad 280, hinge 281, moveable comb drive fingers 292 and 293, supporting arms 311 for the moveable comb drive fingers, supporting arm 300, hinge 296 and mirror 301.

In the depicted example, if the electrical ground is connected to the electrode pad 280, then the hinge 281, moveable comb drive fingers 292 and 293, supporting arms 311 for the moveable comb drive fingers, supporting arm 300, hinge 296 and mirror 301 are at zero electrical potential. When an electrical potential is applied to the fixed comb drive fingers 290 and 291, the resulting electrostatic forces will rotate the hinge 281 and 284, moveable comb drive fingers 292 and 293, supporting arms 311 for the moveable comb drive fingers, supporting arm 300, hinge 296 and mirror 301 clockwise and counterclockwise about the Y axis/hinge 281 and 284. When an electrical potential is applied to the electrode 283, the electrical potential is transferred to the fixed comb drive fingers 287 through the electrical conductive silicon hinge 284, connection part 312, pad 286, the resulting electrostatic forces will rotate the mirror 301 counterclockwise about the X axis/hinge 296.

FIG. 30*b* shows a mirror structure with a vertical comb drive actuator 310 and 311 to tilt the mirror 301 clockwise and counterclockwise about the X axis/hinge 296.

The design variations can be implemented to the mirror structure shown in FIGS. 30*a* and 30*b*. For example, in FIG. 30*b*, a balance weight part can be added between hinge 296 and vertical comb drive actuator 311, and vertical comb drive actuator 310 can be moved to the end edge 312 of the mirror 310.

The mirror structures shown in FIG. 30*a*-30*b* may be used to form the mirror array structures shown in FIG. 22*b*, FIG. 22*c*, FIG. 24*b*, FIG. 25*b*, FIG. 27*a*, FIG. 27*b* and FIG. 28*b*.

The invention claimed is:

1. A micromirror comprising:
- a mirror pivotally attached to a mount by a first pivoting structure that permits pivotal movement of the mirror relative to the mount about a first axis;
- a first comb drive having a first portion fixed relative to the mirror and second portion fixed relative to the mount, the first comb drive being for actuating the mirror about the first axis;
- a third comb drive having a first portion fixed relative to the mirror and a second portion fixed relative to the mount, the third comb drive being for actuating the mirror about the first axis in a direction opposite the first comb drive; and
- a weight connected to the mirror, the weight and mirror being on opposite sides of a fulcrum of the first pivoting structure, wherein the first axis is non-parallel to a longitudinal axis extending through the weight and the mirror.

2. The micromirror of claim 1, further comprising:
- a first support structure pivotally attached to the mount by a second pivoting structure that permits pivotal movement of the first support structure relative to the mount about a second axis, the second axis being non-parallel to the first axis; and
- a second comb drive having a first portion fixed relative to the mount and a second portion fixed relative to the first support structure, and the second comb drive being for actuating the mount about the second axis.

3. The micromirror of claim 2, wherein the first comb drive is positioned between the fulcrum and the weight, and the mirror is positioned between the first and the second comb drives, the first comb drive being adjacent the fulcrum.

4. The micromirror of claim 3,
- wherein the mirror is positioned between the fulcrum and the third comb drive, the mirror being adjacent the fulcrum.

5. The micromirror of claim 2, wherein the first comb drive is positioned between the second comb drive and the weight, the weight being adjacent the fulcrum.

6. The micromirror of claim 5, further comprising:
- a third comb drive having a first portion fixed relative to the mirror and a second portion fixed relative to the mount, the third comb drive being for actuating the mirror about the first axis together with the first comb drive, wherein the mirror is positioned between the fulcrum and the third comb drive, the mirror being adjacent the fulcrum.

7. The micromirror of claim 1, wherein the first axis is perpendicular to the longitudinal axis.

8. The micromirror of claim 1, wherein the weight and the mirror have an equivalent inertial torque on the fulcrum.

9. A micromirror array comprising:
- a plurality of micromirrors, each of the micromirrors comprising:
  - a mirror pivotally attached to a mount by a first pivoting structure that permits pivotal movement of the mirror relative to the mount about a first axis;
  - a first comb drive having a first position portion fixed relative to the mirror and a second portion fixed relative to the mount, the first comb drive being for actuating the mirror about the first axis;
  - a third comb drive having a first portion fixed relative to the mirror and a second portion fixed relative to the mount, the third comb drive being for actuating the mirror about the first axis together with the first comb drive; and
  - a weight connected to the mirror, the weight and the mirror being on opposite sides of a fulcrum of the first pivoting structure, wherein the first axis is non-parallel to a longitudinal axis extending through the weight and the mirror.

10. The micromirror array of claim 9, each of the micromirrors further comprising:
- a first support structure pivotally attached to the mount by a second pivoting structure that permits pivotal movement of the first support structure relative to the mount about a second axis, the second axis being non-parallel to the first axis; and
- a second comb drive having a first portion fixed relative to the mount and a second portion fixed relative to the first support structure, and the second comb drive being for actuating the mount about the second axis.

11. The micromirror array of claim 10, wherein the first comb drive is positioned between the fulcrum and the weight, and the mirror is positioned between the first and the second comb drives, the first comb drive being adjacent the fulcrum.

12. The micromirror array of claim 11, wherein the mirror of each of the micromirrors is positioned between the fulcrum and the third comb drive, the mirror being adjacent the fulcrum.

13. The micromirror array of claim 10, wherein the first comb drive is positioned between the second comb drive and the weight, the weight being adjacent the fulcrum.

14. The micromirror array of claim 13, each of the micromirrors further comprising:

a third comb drive having a first portion fixed relative to the mirror and a second portion fixed relative to the mount, the third comb drive being for actuating the mirror about the first axis together with the first comb drive, wherein the mirror is positioned between the fulcrum and the third comb drive, the mirror being adjacent the fulcrum.

15. The micromirror array of claim 9, wherein the first axis is perpendicular to the longitudinal axis.

16. The micromirror array of claim 9, wherein the weight and the mirror have an equivalent inertial torque on the fulcrum.

17. A micromirror array comprising:

a plurality of micromirrors attached to a mount, each micromirror comprising:

a first end and a second end, the second end being connected to the mount;

a mirror at the first end;

a hinge attached to the mount, the hinge being for permitting rotation of the mirror about a first axis; and a first comb drive for actuating the mirror about the first axis; and first and second rows of the micromirrors, the micromirrors being positioned such that the first ends of the mirrors in the first and the second rows are opposite one another.

18. The micromirror array of claim 17, wherein the mirror is rotatable about a second axis, and each of the micromirrors further comprises a second comb drive for actuating the mirror about the second axis.

19. The micromirror array of claim 17, wherein the first axis is perpendicular to the second axis.

20. The micromirror array of claim 18, wherein the first axis is perpendicular to the second axis.

21. The micromirror of claim 1, wherein the first comb drive is positioned along the longitudinal axis between the weight and the mirror.

22. The micromirror of claim 21, wherein the first comb drive is positioned along the longitudinal axis on a side of the fulcrum opposite the mirror and between the fulcrum and the weight.

23. The micromirror of claim 1, wherein the weight is positioned along the longitudinal axis between the first comb drive and the mirror.

24. The micromirror of claim 2, wherein the longitudinal axis and the second axis are collinear, and the weight and the first comb drive are positioned along the second axis between the second comb drive and the fulcrum of the first pivoting structure.

25. The micromirror of claim 24, wherein the weight is positioned between the second comb drive and the first comb drive, and the first comb drive is positioned between the weight and the fulcrum.

26. The micromirror of claim 24, wherein the first comb drive is positioned between the second comb drive and the weight, and the weight is positioned between the first comb drive and the fulcrum.

27. The micromirror of claim 24, further comprising:

a third comb drive having a first portion fixed relative to the mirror and second portion fixed relative to the mount, the third comb drive actuating the mirror about the first axis together with the first comb drive, wherein the mirror and the third comb drive are positioned along the second axis on a side of the fulcrum opposite the first comb drive and the weight.

28. The micromirror of claim 27, wherein the first, the second, and the third comb drives and the weight, the fulcrum and the mirror are arranged along the second axis in an order of: the second comb drive, the weight, the first comb drive, the fulcrum, the third comb drive and the mirror.

29. The micromirror of claim 27, wherein the first, the second, and the third comb drives and the weight, the fulcrum and the mirror are arranged along the second axis in an order of: the second comb drive, the weight, the first comb drive, the fulcrum, the mirror and the third comb drive.

30. The micromirror of claim 27, wherein the first, the second, and the third comb drives and the weight, the fulcrum and the mirror are arranged along the second axis in an order of: the second comb drive, the first comb drive, the weight, the fulcrum, the mirror and the third comb drive.

* * * * *